(12) United States Patent
Fan et al.

(10) Patent No.: US 12,058,924 B2
(45) Date of Patent: Aug. 6, 2024

(54) TEST SUBSTRATE AND MANUFACTURING METHOD THEREFOR, TEST METHOD, AND DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lei Fan, Beijing (CN); Zheng Bao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 994 days.

(21) Appl. No.: 16/981,938

(22) PCT Filed: Dec. 23, 2019

(86) PCT No.: PCT/CN2019/127421
§ 371 (c)(1),
(2) Date: Sep. 17, 2020

(87) PCT Pub. No.: WO2020/140783
PCT Pub. Date: Jul. 9, 2020

(65) Prior Publication Data
US 2021/0020084 A1   Jan. 21, 2021

(30) Foreign Application Priority Data

Jan. 3, 2019   (CN) .......................... 201910005365.6

(51) Int. Cl.
*H10K 71/70*   (2023.01)
*G02F 1/1362*   (2006.01)
(Continued)

(52) U.S. Cl.
CPC ........... *H10K 71/70* (2023.02); *G02F 1/1368* (2013.01); *G09G 3/006* (2013.01);
(Continued)

(58) Field of Classification Search
CPC . G02F 1/1368; G02F 1/136254; G09G 3/006; H01L 29/78651; H10K 71/00
(Continued)

(56) References Cited

U.S. PATENT DOCUMENTS 10,019,955 B2 * 7/2018 Cui ........................ G09G 3/006
2005/0218324 A1 10/2005 Street
(Continued)

FOREIGN PATENT DOCUMENTS

CN           1957444 A       5/2007
CN         101501516 A       8/2009
(Continued)

OTHER PUBLICATIONS

Office Action dated May 26, 2020 in counterpart CN Patent Application No. 201910005365.6, 23 pages.
(Continued)

*Primary Examiner* — Charles S Chang
(74) *Attorney, Agent, or Firm* — Procopio, Cory, Hargreaves & Savitch LLP

(57) ABSTRACT

A test substrate has at least one test region and includes a base substrate, a plurality of thin film transistors disposed on the base substrate, at least one test hole located in the test region, and at least one test pin. At least one of the thin film transistors is a target thin film transistor to be tested, each target thin film transistor is located in one test region. Each test hole exposes a source region, a drain region or a gate of a corresponding target thin film transistor at a bottom thereof. Each test pin is located in one test hole. One end of the test pin passes through the test hole to be coupled to the
(Continued)

source region, the drain region or the gate of the corresponding target thin film transistor, and another end of the test pin is exposed at a surface of the test substrate.

20 Claims, 20 Drawing Sheets

(51) Int. Cl.
 *G02F 1/1368* (2006.01)
 *G09G 3/00* (2006.01)
 *H01L 29/786* (2006.01)
 *H10K 71/00* (2023.01)
(52) U.S. Cl.
 CPC ....... *H01L 29/78651* (2013.01); *H10K 71/00* (2023.02); *G02F 1/136254* (2021.01)
(58) Field of Classification Search
 USPC .............................................. 349/54–55, 192
 See application file for complete search history.

(56) References Cited

U.S. PATENT DOCUMENTS

| | | |
|---|---|---|
| 2008/0224724 A1 | 9/2008 | Glazer et al. |
| 2008/0283836 A1 | 11/2008 | Lee |
| 2009/0284123 A1 | 11/2009 | Nishida et al. |
| 2009/0296039 A1 | 12/2009 | Park |
| 2011/0273640 A1 | 11/2011 | Zhang |
| 2014/0138685 A1 | 5/2014 | Zhang |
| 2017/0017130 A1 | 1/2017 | Yang |
| 2017/0154983 A1 | 6/2017 | Yamazaki et al. |
| 2021/0020084 A1 | 1/2021 | Fan et al. |

FOREIGN PATENT DOCUMENTS

| | | |
|---|---|---|
| CN | 101582357 A | 11/2009 |
| CN | 102053098 A | 5/2011 |
| CN | 102236179 A | 11/2011 |
| CN | 102944959 A | 2/2013 |
| CN | 104503174 A | 4/2015 |
| CN | 104658970 A | 5/2015 |
| CN | 104778908 A | 7/2015 |
| CN | 105046007 A | 11/2015 |
| CN | 105527769 A | 4/2016 |
| CN | 105589275 A | 5/2016 |
| CN | 106409708 A | 2/2017 |
| CN | 106960805 A | 7/2017 |
| CN | 107623011 A | 1/2018 |
| CN | 107884693 A | 4/2018 |
| CN | 108922939 A | 11/2018 |
| CN | 109061914 A | 12/2018 |
| CN | 109742037 A | 5/2019 |
| JP | 2006337034 A | 12/2006 |

OTHER PUBLICATIONS

Office Action dated Oct. 19, 2020 in counterpart CN Patent Application No. 201910005365.6, 13 pages.

* cited by examiner

TEST SUBSTRATE AND MANUFACTURING METHOD THEREFOR, TEST METHOD, AND DISPLAY SUBSTRATE

CROSS-REFERENCE TO RELATED APPLICATIONS

This application is a national phase entry under 35 USC 371 of International Patent Application No. PCT/CN2019/127421 filed on Dec. 23, 2019, which claims priority to Chinese Patent Application No. 201910005365.6, filed Jan. 3, 2019, the contents of which are incorporated herein by reference in their entirety.

TECHNICAL FIELD

The present disclosure relates to the field of display technologies, and in particular, to a test substrate and a method for manufacturing the same, a method for testing a test substrate and a display substrate.

BACKGROUND

At present, in order to analyze poor display performance of a display substrate, structural inspection (e.g., determining whether there are short circuits or open circuits in circuit structures) is generally performed on circuit structures in a display device by inspecting poor display regions with an optical microscope or by observing the poor display regions with a scanning electron microscope. However, the above methods cannot be used to test electrical characteristics of the circuit structures.

SUMMARY

In one aspect, a test substrate is provided. The test substrate has at least one test region. The test substrate includes a base substrate, a plurality of thin film transistors disposed on a first side of the base substrate, at least one test hole located in the at least one test region, and at least one test pin. Each of the thin film transistors includes a silicon island and a gate, and the silicon island includes a source region, a drain region, and an active region between the source region and the drain region. At least one of the thin film transistors is a target thin film transistor that is to be tested. Each target thin film transistor is located in one of the at least one test region. Each of the at least one test hole exposes a source region, a drain region or a gate of a corresponding target thin film transistor at a bottom of the test hole. Each of the at least one test pin is located in one of the at least one test hole. One end of the test pin passes through the test hole to be coupled to the source region, the drain region or the gate of the corresponding target thin film transistor, and another end of the test pin is exposed at a surface of the test substrate.

In some embodiments, the test substrate further includes a data lead layer disposed on a side of the plurality of thin film transistors away from the base substrate, the data lead layer includes a plurality of data leads exposed at the surface of the test substrate. The test pin is coupled to one of the data leads. At least one of the source region, the drain region and the gate of the target thin film transistor is coupled to a data lead, and each of the at least one of the source region, the drain region and the gate is coupled to a respective one of the data leads.

In some embodiments, the test substrate further includes an interlayer insulating layer, a data lead layer and a plurality of via holes. The interlayer insulating layer is disposed on a side of the plurality of thin film transistors away from the base substrate. The data lead layer is disposed on a side of the interlayer insulating layer away from the base substrate, and the data lead layer includes a plurality of data leads exposed at the surface of the test substrate. The plurality of via holes penetrate at least the interlayer insulating layer.

In a case where one of the source region, the drain region and the gate of the target thin film transistor is directly coupled to a data lead through one of the via holes, there are two test holes and two test pins located in the two test holes in the test region; and the two test pins are coupled to two of the source region, the drain region and the gate of the target thin film transistor that are not directly coupled to the data leads through the via hole, respectively. Or, in a case where two of the source region, the drain region and the gate of the target thin film transistor are directly coupled to the data leads through two of the via holes, there is a test hole and a test pin located in the test hole in the test region; and the test hole is coupled to one of the source region, the drain region and the gate of the target thin film transistor that is not directly coupled to the data leads through the two via holes.

In some embodiments, the test substrate further includes an interlayer insulating layer, a data lead layer and a plurality of via holes. The interlayer insulating layer is disposed on a side of the plurality of thin film transistors away from the base substrate. The data lead layer is disposed on a side of the interlayer insulating layer away from the base substrate, and the data lead layer includes a plurality of data leads exposed at the surface of the test substrate. The plurality of via holes penetrate at least the interlayer insulating layer. In a case where none of the source region, the drain region and the gate of the target thin film transistor are directly coupled to data leads through the via holes, there are three test holes and three test pins located in the three test holes in the test region. The three test pins are coupled to the source region, the drain region and the gate of the target thin film transistor, respectively.

In some embodiments, the test substrate further includes a plurality of thin film layers disposed on the first side of the base substrate. The plurality of thin film layers form the plurality of thin film transistors, and the plurality of thin film layers include at least one conductive thin film layer. Each thin film layer of the at least one conductive thin film layer is severed around the test region, and the test region is electrically separated from other regions. The other regions include other test regions in the at least one test region other than the test region, and a non-test region in the display substrate other than the at least one test region.

In some embodiments, an orthographic projection of the test pin on the base substrate of the test substrate is within an orthographic projection of the source region, the drain region or the gate to which the test pin is coupled on the base substrate.

In another aspect, a method for manufacturing the above test substrate is provided. The manufacturing method includes: providing a first display substrate, the first display substrate including a base substrate and a plurality of thin film transistors disposed on a first side of the base substrate; determining at least one target thin film transistor that is to be tested from the plurality of thin film transistors of the first display substrate; each of the at least one target thin film transistor including a silicon island and a gate, and the silicon island including a source region, a drain region and an active region between the source region and the drain region; at least one test region being defined on the first display substrate, and the target thin film transistor being located in one of the at least one test region; forming at least one test hole in the test region, each of the at least one test hole exposing a source region, a drain region or a gate of a target thin film transistor at a bottom of the test hole; and forming a test pin in the test hole, the test pin being coupled to the source region, the drain region or the gate that is exposed by the test hole in which the test pin is located.

In some embodiments, in a case where the first display substrate further includes a data lead layer disposed on a side of the plurality of thin film transistors away from the base substrate, and the data lead layer includes a plurality of data leads exposed at a surface of the first display substrate, the manufacturing method further includes: coupling the test pin to one data lead of the plurality of data leads after the test pin is formed in the test hole. The one data lead is adjacent to the test pin, and is not directly coupled to any one of a source region, a drain region and a gate of a target thin film transistor corresponding to the test pin.

In some embodiments, in a case where the first display substrate further includes a data lead layer disposed on a side of the plurality of thin film transistors away from the base substrate, the data lead layer includes a plurality of data leads exposed at a surface of the first display substrate, and one of the source region, the drain region and the gate of the target thin film transistor is directly coupled to a data lead, forming the at least one test hole in the test region includes: forming two test holes in the test region; the two test holes exposing two of the source region, the drain region and the gate of the target thin film transistor that are not directly coupled to data lead. Or, in a case where the first display substrate further includes the data lead layer disposed on the side of the plurality of thin film transistors away from the base substrate, the data lead layer includes the plurality of data leads exposed at the surface of the first display substrate, and two of the source region, the drain region and the gate of the target thin film transistor are directly coupled to the data leads, forming the at least one test hole in the test region includes: forming a test hole in the test region. The test hole exposes one of the source region, the drain region and the gate of the target thin film transistor that is not directly coupled to the data leads.

In some embodiments, in a case where the first display substrate further includes a data lead layer disposed on a side of the plurality of thin film transistors away from the base substrate, the data lead layer includes a plurality of data leads exposed at a surface of the first display substrate, and none of the source region, the drain region and the gate of the target thin film transistor are directly coupled to data leads, forming the at least one test hole in the test region includes: forming three test holes in the test region; the three test holes exposing the source region, the drain region and the gate of the target thin film transistor.

In some embodiments, in a case where the first display substrate further includes a plurality of thin film layers disposed on the first side of the base substrate, the plurality of thin film layers form the plurality of thin film transistors, and the plurality of thin film layers include at least one conductive thin film layer, the manufacturing method further includes: severing each thin film layer of the at least one conductive thin film layer around the test region, so that the test region is electrically separated from other regions. The other regions include other test regions in the at least one test region other than the test region, and a non-test region in the display substrate other than the at least one test region.

In some embodiments, forming the at least one test hole in the test region includes: forming the at least one test hole by performing a sputtering process at a position corresponding to at least one of the source region, the drain region and the gate of the target thin film transistor by using a focused ion beam sputtering process according to at least one sputtering calculation model, so as to form the at least one test hole. Parameters of each of the at least one sputtering calculation model include a size of an opening of a test hole to be formed, a depth of the test hole to be formed, and a voltage and/or a current applied to an ion beam.

In some embodiments, forming the at least one test hole in the test region further includes: detecting an actual sputtering depth of the test hole to be formed by using an end-point detection method when the sputtering is performed at the position corresponding to the at least one of the source region, the drain region and the gate of the target thin film transistor; obtaining an image of the test hole to be formed in a case where a depth difference between a target sputtering depth and the actual sputtering depth is within a depth threshold range, and the image of the test hole being an electron beam image and/or an ion beam image; and continuing performing the sputtering process in the test hole to be formed according to the image of the test hole until the actual sputtering depth of the test hole to be formed is the same as the target sputtering depth.

In some embodiments, forming the test pin in the test hole, the test pin being coupled to the source region, the drain region or the gate that is exposed by the test hole in which the test pin is located includes: depositing a metal in the test hole by using a focused ion beam deposition process, so as to form the test pin.

In some embodiments, the manufacturing method further includes: removing residual metal deposited around the test hole after the test pin is formed in the test hole.

In some embodiments, removing the residual metal around the test hole includes: removing the residual metal deposited around the test hole by using a focused ion beam sputtering process; obtaining an image of the target thin film transistor; determining whether the residual metal is completely removed, and the image of the target thin film transistor being an electron beam image and/or an ion beam image; continuing removing the residual metal by using the focused ion beam sputtering process if the residual metal is not completely removed; and stopping removing the residual metal by using the focused ion beam sputtering process if the residual metal is completely removed.

In some embodiments, an orthographic projection of the test pin on the base substrate of the display substrate is within an orthographic projection of a source region, a drain region or a gate of a target thin film transistor to which the test pin is coupled on the base substrate.

In some embodiments, determining the at least one target thin film transistor that is to be tested from the plurality of thin film transistors of the first display substrate includes: performing a lighting test on a second display substrate to obtain a position of a defect, the second display substrate including a plurality of thin film transistors whose number, structures and positions are correspondingly the same as a number, structures and positions of the plurality of thin film transistors on the first display substrate; a thin film transistor at the position of the defect is taken as a defective thin film transistor; and according to the position of the defective thin film transistor in the second display substrate, determining a thin film transistor at a same position in the first display substrate to be the at least one target thin film transistor.

In yet another aspect, a method for testing the above test substrate is provided. The testing method includes: applying voltages to the source region, the drain region and the gate of each of the at least one target thin film transistor of the test substrate, wherein a voltage is applied to at least one of the source region, the drain region and the gate in a way that the voltage is applied to the at least one of the source region, the drain region and the gate through a test pin coupled thereto; obtaining a transfer characteristic curve of the target thin film transistor; obtaining at least one electrical characteristic parameter of the target thin film transistor according to the transfer characteristic curve; and comparing each of the at least one electrical characteristic parameter with a typical value matching the electrical characteristic parameter, so as to obtain abnormal electrical characteristic parameters.

In yet another aspect, a display substrate is provided. The display substrate includes a plurality of thin film transistors. Electrical characteristic parameters of at least one of the plurality of thin film transistors are electrical characteristic parameters obtained after abnormal electrical characteristic parameters are corrected. The abnormal electrical characteristic parameters are electrical characteristic parameters obtained after the test substrate is tested through the above testing method.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods, actual timings of signals and the like that the embodiments of the present disclosure relate to.

DETAILED DESCRIPTION

Figure 1:
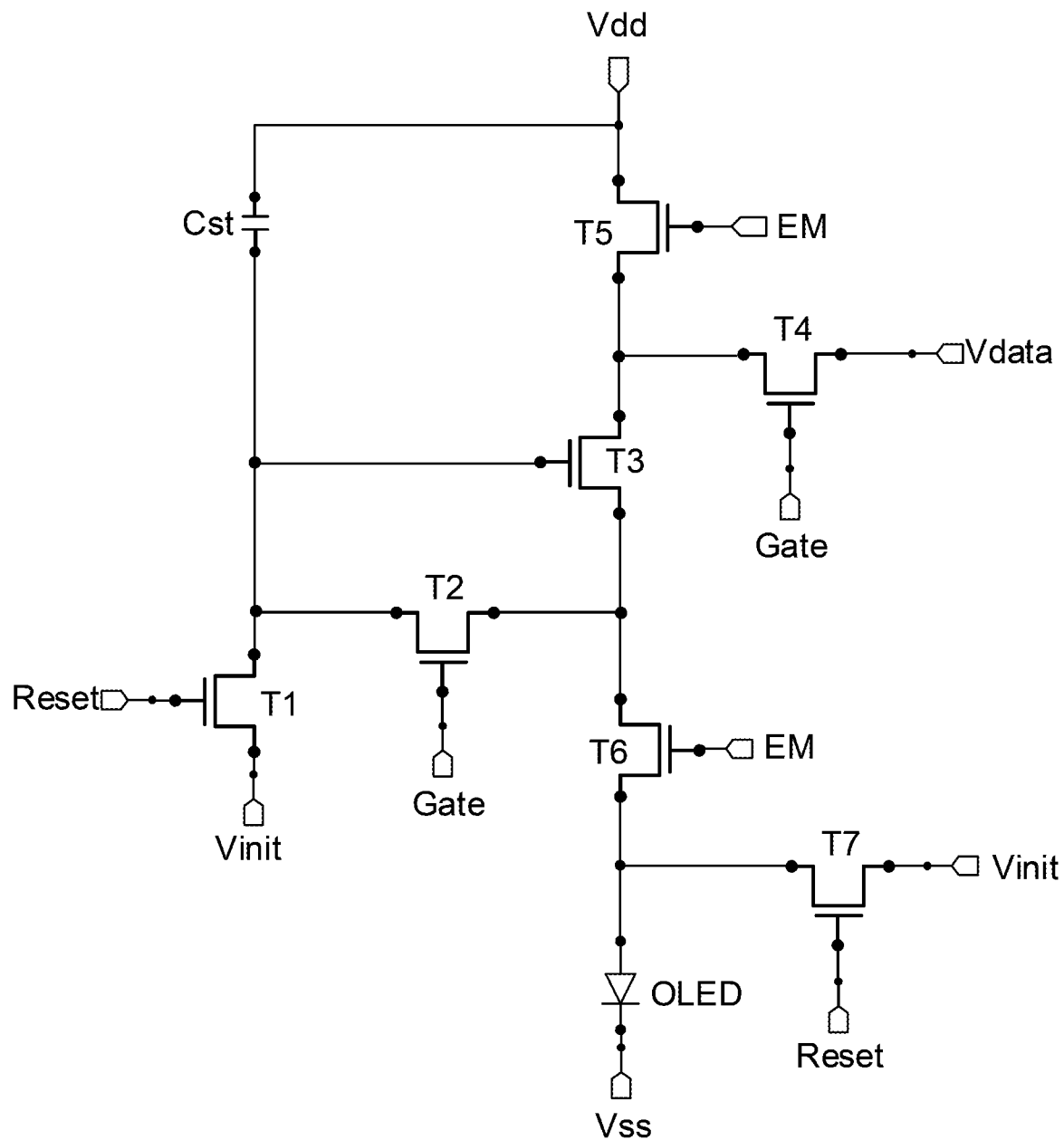
FIG. 1 is a diagram showing a structure of a pixel driver circuit, in accordance with some embodiments.

Technical solutions in some embodiments of the present disclosure will be described clearly and completely with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the terms such as "coupled" or "communicatively coupled" may also mean that two or more components are not in direct contact with each other but still cooperate or interact with each other. The embodiments disclosed herein are not necessarily limited to the contents herein.

The phrase "at least one of A, B and C" has a same meaning as the phrase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In the text, the orientation terms such as "upper" and "lower" are defined according to an orientation in which a test substrate is schematically placed in the accompanying drawings. It will be understood that, these directional terms are relative concepts that are used for relative description and clarification, which may be changed correspondingly according to changes in the orientation in which the test substrate is placed.

At present, a plurality of circuit structures are provided in a thin film transistor liquid crystal display (TFT-LCD) substrate or an organic light-emitting diode (OLED) display substrate.

The plurality of circuit structures in the TFT-LCD substrate include pixel driver circuits each corresponding to a sub-pixel. Each pixel driver circuit is generally provided with a thin film transistor coupled to a pixel electrode. The pixel driver circuit is configured to be turned on under control of a gate scanning signal to transmit a driving signal to the pixel electrode, and to be turned off under control of another gate scanning signal to stop transmitting the driving signal to the pixel electrode.

The plurality of circuit structures in the OLED display substrate generally include pixel driver circuits each corresponding to a sub-pixel. The pixel driver circuits are located in an active area of a TFT backplane. Each pixel driver circuit is provided with a plurality of thin film transistors and at least one light-emitting device. For example, the pixel driver circuit has a 2T1C (i.e., two thin film transistors and a capacitor) structure. Or, as shown in FIG. 1, the pixel driver circuit has a 7T1C structure. The pixel driver circuit with the 7T1C structure includes seven thin film transistors, a capacitor and a light-emitting diode.

In addition, the plurality of circuit structures in the TFT-LCD substrate or the plurality of circuit structures in the OLED display substrate further include a gate driver circuit. The gate driver circuit includes a plurality of thin film transistors, and is configured to implement a shift register function, and to provide signals to all gate lines row by row in one frame to drive the gate lines. In some embodiments, the gate driver circuit including the plurality of thin film transistors is integrated into a non-active area of the TFT-LCD substrate or the OLED display substrate by using a gate driver on array (GOA) design. For example, the non-active area is located at one, two or more sides of the active area.

In the circuit structures, the pixel driver circuit and the gate driver circuit both include a plurality of thin film transistors. Electrical characteristics of the thin film transistors, e.g., electrical characteristics of a driving thin film transistor with a load-carrying function, will directly affect electrical characteristics of the pixel driver circuit or the gate driver circuit including the thin film transistor, thereby affecting a display effect of a display device.

Therefore, by testing the electrical characteristics of the thin film transistors in the pixel driver circuit or the gate driver circuit in the display substrate, in subsequent processes of manufacturing display substrates, a manufacturing process of the thin film transistors may be improved according to the electrical characteristics of the thin film transistors obtained through the test, and the electrical characteristics of the thin film transistors may be improved, thereby achieving a purpose of improving the display effect of the display device.

In the related art, a test unit is generally disposed at a periphery of the active area of the display substrate. An electrical characteristics test is performed on the test unit to obtain electrical characteristics of circuit structures in the active area. However, due to instability of the manufacturing process of the display substrate, it is hard to ensure that the circuit structures in the active area of the display substrate have same electrical characteristics as the test unit in the peripheral region. Therefore, the obtained electrical characteristics of the test unit located in the peripheral region of the display substrate cannot directly and accurately characterize the electrical characteristics of the circuit structures in the active area.

On this basis, in order to directly test the electrical characteristics of the thin fibs transistors in the pixel driver circuit or the gate driver circuit, some embodiments of the present disclosure provide a method for manufacturing a test substrate. As for a test substrate obtained by using the manufacturing method, in a process of performing an electrical test on the circuit structures, defective thin film transistors in the circuit structures can be directly tested. Therefore, in subsequent processes of manufacturing display substrates, processes of manufacturing thin film transistors in the display substrates may be guided and improved according to electrical characteristics of the thin film transistors obtained through the test, thereby achieving a purpose of improving product yield.

Figure 2:
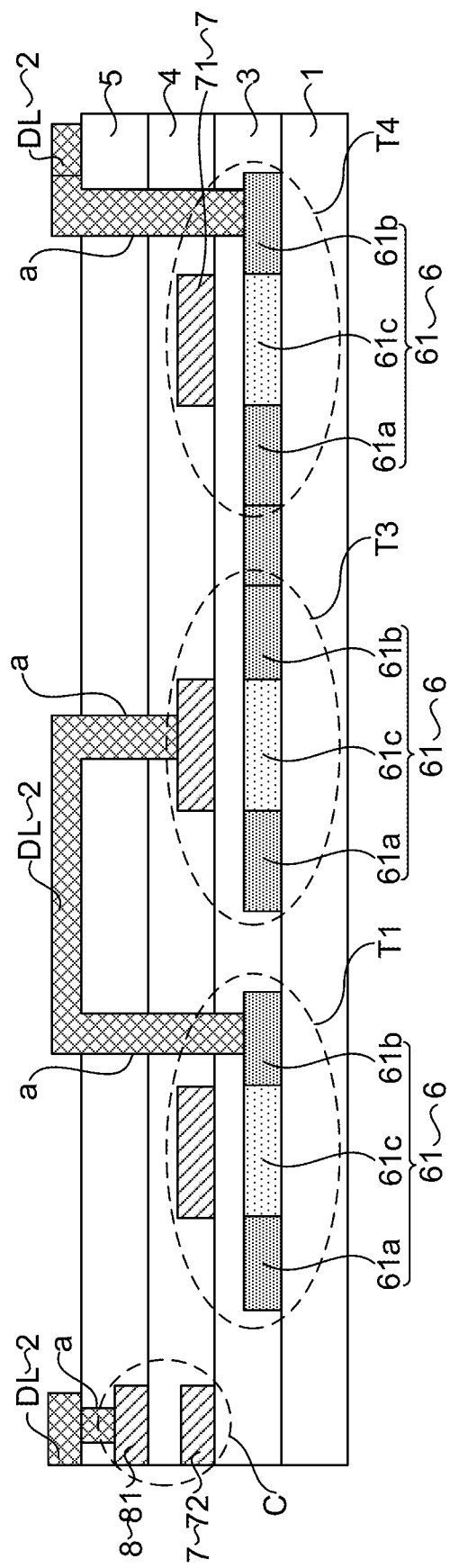
FIG. 2 is a diagram showing a structure of a first display substrate, in accordance with some embodiments.

The test substrate is manufactured on a basis of a first display substrate 01 shown in FIG. 2. Before the method for manufacturing the test substrate is described, the first display substrate 01 on which the manufacturing method is based is described. For example, a pixel driver circuit included in the first display substrate 01 is the pixel driver circuit with the 7T1C structure shown in FIG. 1.

Figure 3:
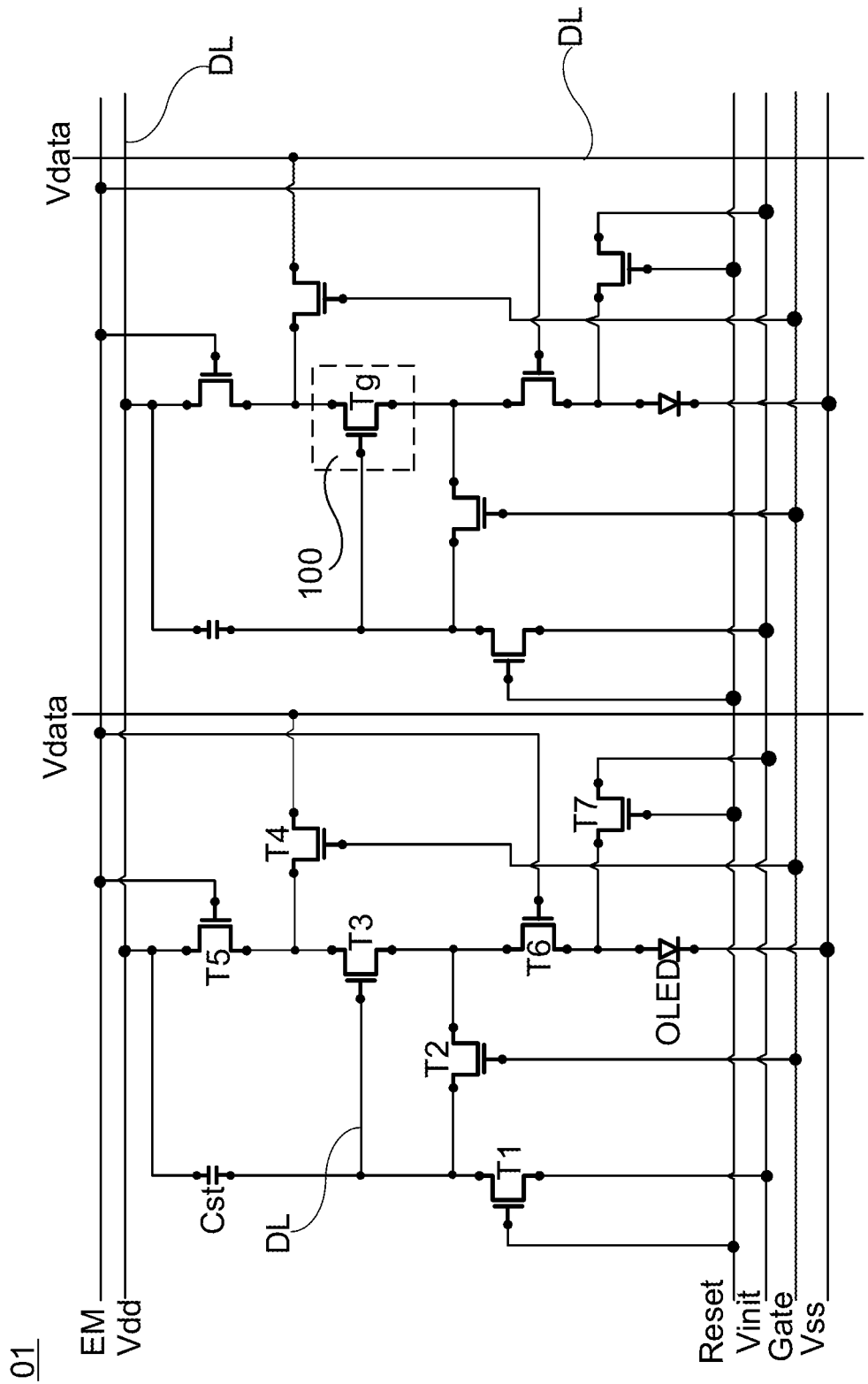
FIG. 3 is a diagram showing a structure of a pixel driver circuit in a first display substrate, in accordance with some embodiments.

It will be noted that, in some embodiments of the present disclosure, as for thin film transistors included in pixel driver circuits shown in FIGS. 1 and 3, in order to facilitate description of circuit connection, each thin film transistor in the circuits includes a gate, a source and a drain. As for thin film transistors included in the first display substrate and the test substrate, each thin film transistor includes a gate and a silicon island. The silicon island includes a source region, a drain region, and an active region between the source region and the drain region. The source region may be regarded as a source and the drain region may be regarded as a drain.

As shown in FIG. 2, the first display substrate 01 includes a base substrate 1, a data lead layer 2, and a plurality of thin film layers between the base substrate 1 and the data lead layer 2.

The plurality of thin film layers are disposed on a first side of the base substrate 1, and the plurality of thin film layers form a plurality of thin film transistors. Each of the plurality of thin film transistors includes a silicon island 61 and a gate 71, and the silicon island 61 includes a source region 61*a*, a drain region 61*b*, and an active region 61*c* between the source region 61*a* and the drain region 61*b*. As an example, three thin film transistors shown in FIG. 2 correspond to a thin film transistor T1, a thin film transistor T3 and a thin film transistor T4 in the pixel driver circuit shown in FIG. 1.

In the first display substrate 01, the plurality of thin film transistors may be bottom-gate thin film transistors or top-gate thin film transistors, which is not limited. The plurality of thin film layers will be described below by taking an example in which the plurality of thin film transistors are the top-gate thin film transistors.

Referring again to FIG. 2, the plurality of thin film layers include a semiconductor layer 6, a first insulating layer 3, a first metal layer 7 and an interlayer insulating layer 5 that are sequentially stacked on the first side of the base substrate 1.

The semiconductor layer 6 includes a plurality of silicon islands 61, and each silicon island 61 of the plurality of silicon islands 61 includes a source region 61a, a drain region 61b, and an active region 61c between the source region 61a and the drain region 61b.

The first insulating layer 3 is disposed on a side of the semiconductor layer 6 away from the base substrate 1.

The first metal layer 7 includes a plurality of gates 71, and a position of each gate 71 of the plurality of gates 71 corresponds to a position of each silicon island 61.

The interlayer insulating layer 5 is disposed on a side of the gates 71 away from the base substrate 1.

The data lead layer 2 is disposed on a side of the interlayer insulating layer 5 away from the base substrate 1. In the first display substrate 01, the data lead layer 2 is a surface layer of the first display substrate 01. The data lead layer 2 includes a plurality of data leads DL, and the plurality of data leads DL are exposed at a surface of the first display substrate 01.

In some examples, the plurality of data leads DL include a plurality of signal lines disposed in the data lead layer 2, and each of the plurality of signal lines is configured to transmit a signal. For example, as shown in FIG. 3, the first display substrate 01 includes the plurality of signal lines such as gate lines, initial signal lines, reset signal lines, enabling signal lines, data lines, first voltage signal lines and second voltage signal lines. A gate line is configured to transmit a gate scanning signal Gate, an initial signal line is configured to transmit an initial signal Vinit, a reset signal line is configured to transmit a reset signal Reset, an enabling signal line is configured to transmit an enabling signal EM, a data line is configured to transmit a data signal Data, a first voltage signal line is configured to transmit a first supply voltage Vdd, and a second voltage signal line is configured to transmit a second supply voltage Vss.

In some embodiments, at least one type of signal lines of the above signal lines is disposed in the data lead layer 2, remaining signal lines are disposed in other thin film layers of the first display substrate 01. The plurality of data leads DL include the signal lines disposed in the data lead layer 2. For example, in a case where the data lines and the first voltage signal lines are disposed in the data lead layer 2, the plurality of data leads DL include the data lines and the first voltage signal lines. A description will be made below by taking an example in which the data lines and the first voltage signal lines are disposed in the data lead layer 2.

In some other examples, the plurality of data leads DL include a plurality of connecting lines disposed in the data lead layer 2, and each connecting line of the plurality of connecting lines is configured to connect devices located at both ends of the connecting line. For example, as shown in FIGS. 2 and 3, a gate 71 of the thin film transistor T3 is coupled to an electrode (e.g., a drain) of the thin film transistor T1 via a connecting line, and the connecting line is a data lead DL.

In some embodiments, taking the example in which the pixel driver circuit in the first display substrate 01 is the pixel driver circuit with the 7T1C structure shown in FIG. 1, each pixel driver circuit includes a capacitor, and the first display substrate 01 further includes a plurality of capacitors. As shown in FIG. 2, the first metal layer 7 further includes a plurality of first electrodes 72 serving as lower electrodes of the capacitors besides the plurality of gates 71. The first display substrate 01 further includes a second insulating layer 4 disposed on a side of the first metal layer 7 away from the base substrate 1, and a second electrode layer 8 disposed on a side of the second insulating layer 4 away from the base substrate 1. The second electrode layer 8 includes a plurality of second electrodes 81 each corresponding to a respective one of the plurality of first electrodes 72 and serving as an upper electrode of the capacitor.

In each pixel driver circuit, the lower electrode of the capacitor is coupled to the gate 71 of the thin film transistor T3, and the upper electrode of the capacitor is coupled to a second voltage signal line.

In some embodiments, the first display substrate 01 further includes a plurality of via holes a, and each via hole a of the plurality of via holes a penetrates at least the interlayer insulating layer 5. For example, as shown in FIG. 2, a via hole a penetrating the first insulating layer 3, the second insulating layer 4 and the interlayer insulating layer 5 is disposed on a drain region 61b of the thin film transistor T4, and the drain region 61b of the thin film transistor T4 is directly coupled (a coupling between a drain region, a source region or a gate of a thin film transistor and a data lead through a via hole a being referred to as a direct coupling) to the data lead DL (the data lead DL being a data line) through the via hole a. A via hole a penetrating the second insulating layer 4 and the interlayer insulating layer 5 is disposed on the gate 71 of the thin film transistor T3, a via hole a penetrating the first insulating layer 3, the second insulating layer 4 and the interlayer insulating layer 5 is disposed on a drain region 61b of the thin film transistor T1, and both ends of a data lead DL pass through the two via holes a to directly couple the gate 71 of the thin film transistor T3 to the drain region 61b of the thin film transistor T1. A via hole a penetrating the interlayer insulating layer 5 is disposed on a second electrode 81 of a capacitor, and the second electrode 81 of the capacitor is coupled to a data lead DL (the data lead DL being a second voltage signal line) through the via hole a.

As shown in FIG. 3, a source (or a drain) of a thin film transistor may be coupled to a source (or a drain) of another thin film transistor. For example, a drain of the thin film transistor T3 is coupled to a source of the thin film transistor T4. In this case, in the first display substrate 01, a silicon island 61 of the thin film transistor T3 and a silicon island 61 of the thin film transistor T4 are both located in the semiconductor layer 6, and a drain region 61b of the thin film transistor T3 and a source region 61a of the thin film transistor T4 are of an integrated structure and do not need to be coupled through a via hole a.

Figure 4:
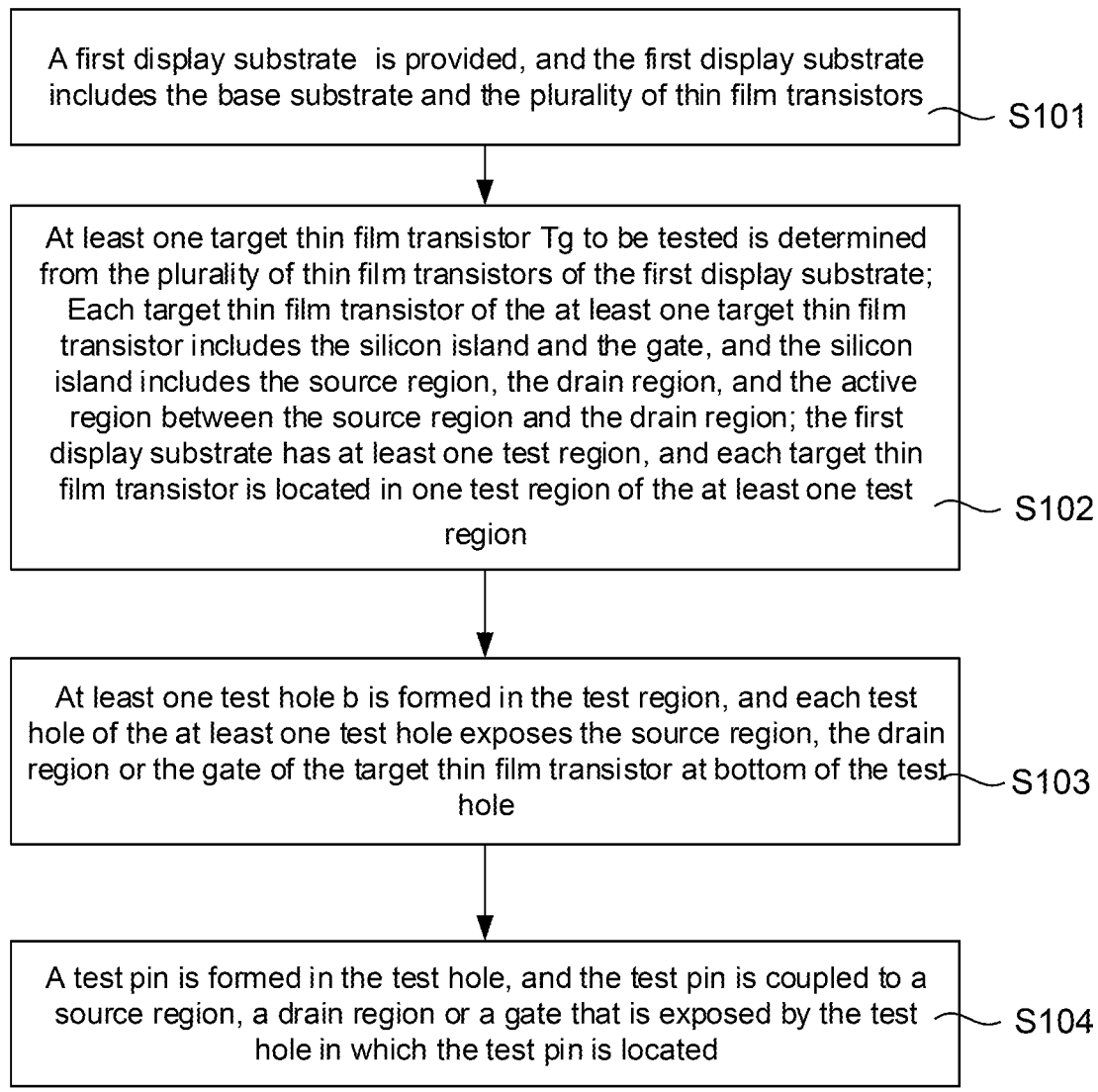
FIG. 4 is a flow diagram of a method for manufacturing a test substrate, in accordance with some embodiments.

On a basis of the first display substrate 01 described above, as shown in FIG. 4, the method for manufacturing the test substrate provided by some embodiments of the present disclosure includes S101 to S104.

In S101, a first display substrate 01 is provided. The first display substrate 01 is the first display substrate 01 described above. That is to say, the provided first display substrate 01 is a display substrate manufactured from the beginning of a base substrate 1 to a data lead layer 2. It will be understood that, a first display substrate 01 that has been manufactured may be directly used in this step, or the first display substrate 01 may be manufactured in this step. The method for manufacturing the first display substrate 01 will be described below. Referring to FIG. 2, the first display substrate 01 includes the base substrate 1 and the plurality of thin film transistors, such as the thin film transistor T1, the thin film transistor T3 and the thin film transistor T4, disposed on the first side of the base substrate 1.

In S102, as shown in FIG. 3, at least one target thin film transistor Tg to be tested is determined from the plurality of thin film transistors of the first display substrate 01. Each target thin film transistor Tg of the at least one target thin film transistor Tg includes the silicon island 61 and the gate 71, and the silicon island 61 includes the source region 61*a*, the drain region 61*b*, and the active region 61*c* between the source region 61*a* and the drain region 61*b*. In addition, the first display substrate 01 has at least one test region 100, and each target thin film transistor Tg is located in one test region 100 of the at least one test region 100.

For example, referring to FIGS. 2 and 3, taking a pixel region of the first display substrate 01 as an example, in thin film transistors included in a pixel driver circuit of the pixel region, the thin film transistor T3 is determined as a target thin film transistor Tg to be tested, A test region 100 is defined in the pixel region, and the target thin film transistor Tg is located in the test region 100.

For example, if the thin film transistor T1, the thin film transistor T3 and the thin film transistor T4 are determined as target thin film transistors Tg, three test regions 100 are divided from the pixel region, and the three target thin film transistors Tg are located in the three test regions 100, respectively.

Figure 5A:
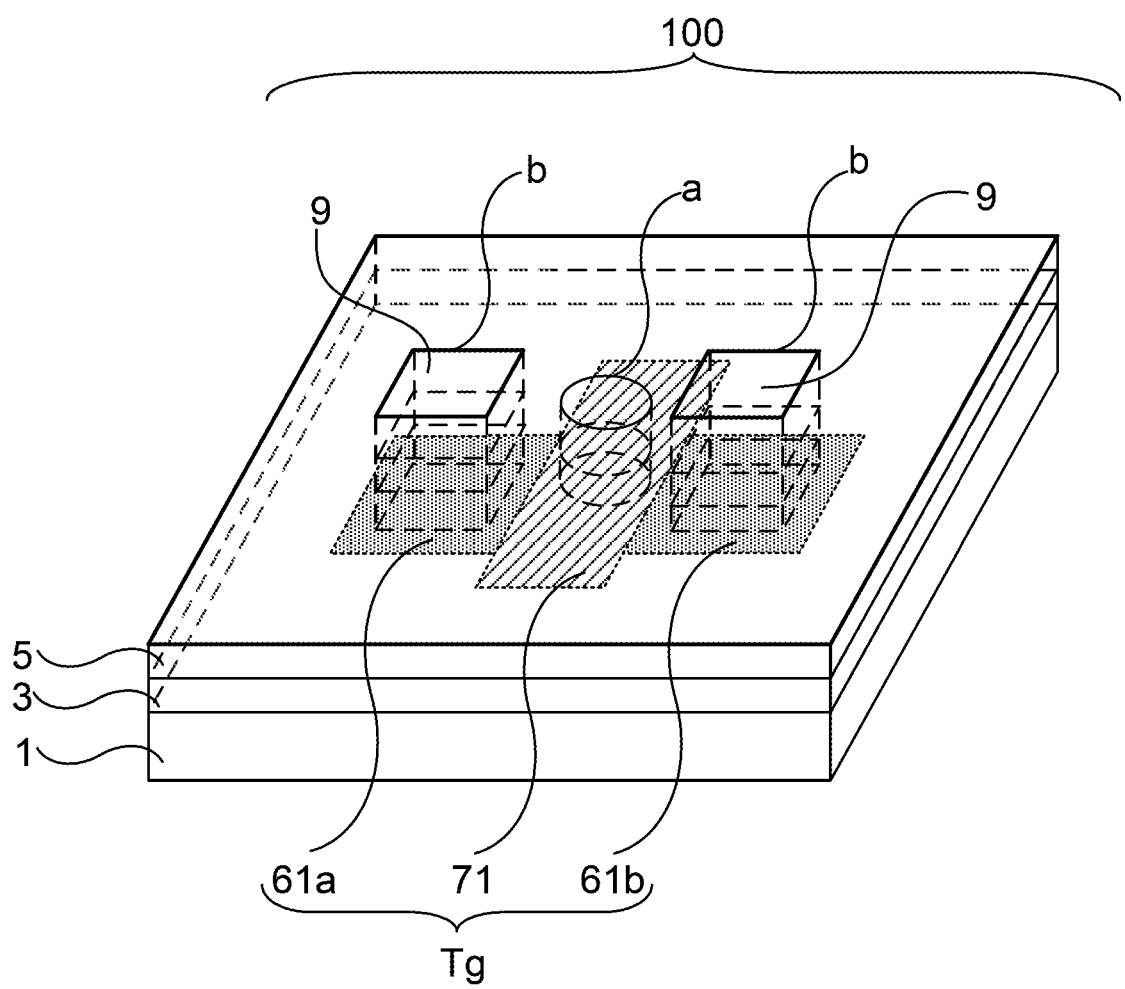
FIG. 5A is a diagram showing a structure of a target thin film transistor in a test substrate, in accordance with some embodiments.
Figure 5B:
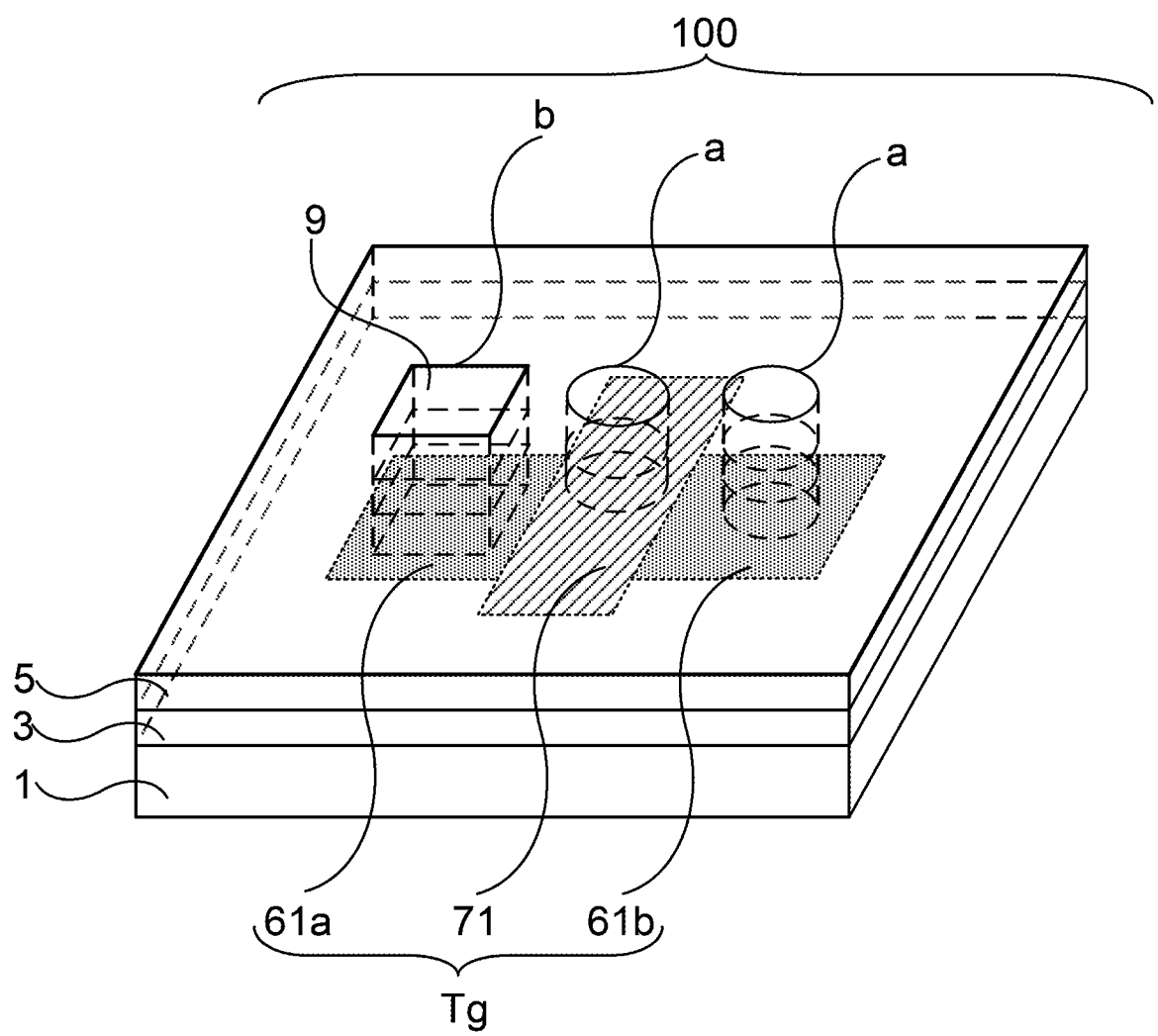
FIG. 5B is a diagram showing a structure of another target thin film transistor in a test substrate, in accordance with some embodiments.

In S103, referring to FIG. 5A to 5B, at least one test hole b is formed in the test region 100, and each test hole b of the at least one test hole b exposes the source region 61*a*, the drain region 61*b* or the gate 71 of the target thin film transistor Tg at bottom of the test hole.

For example, referring to FIG. 5A, taking a test region 100 corresponding to the thin film transistor T3 as an example, two test holes b are formed in the test region 100. A source region 61*a* of the thin film transistor T3 is exposed at a bottom of one test hole b, and the drain region 61*b* of the thin film transistor T3 is exposed at a bottom of the other test hole b.

In S104, a test pin 9 is formed in the test hole b, and the test pin 9 is coupled to a source region 61*a*, a drain region 61*b* or a gate 71 that is exposed by the test hole b in which the test pin 9 is located.

The test pin 9 is in contact with the source region 61*a*, the drain region 61*b* or the gate 71 that is exposed by the test hole b in which the test pin 9 is located, so that the test pin 9 may be coupled to the source region 61*a*, the drain region 61*b* or the gate 71 of the target thin film transistor Tg.

For example, test pins 9 are formed in the two test holes b corresponding to the thin film transistor T3. One test pin 9 is coupled to the source region 61*a* exposed by one test hole b, and the other test pin 9 is coupled to the drain region 61*b* exposed by the other test hole b.

In the test substrate obtained by using the above method for manufacturing the test substrate, in the process of performing the electrical test on the circuit structures, a defective thin film transistor in the circuit structures may be directly used as a target thin film transistor Tg to be tested. Accordingly, a voltage is transmitted to the source region 61*a*, the drain region 61*b* or the gate 71 to which the test pin 9 is coupled through the test pin 9, and then electrical characteristics of the target thin film transistor Tg are tested. In this way, regardless of whether the thin film transistors are included in the pixel driver circuit in the active area or included in the gate driver circuit in the non-active area, they may both be tested. Therefore, in subsequent processes of manufacturing display substrates, the manufacturing process of the thin film transistors in the display substrate may be guided and improved according to the electrical characteristics of the thin film transistors obtained through the test, thereby achieving the purpose of improving the product yield.

In some embodiments, in a case where one of the source region 61*a*, the drain region 61*b* and the gate 71 of the target thin film transistor Tg is directly coupled to a data lead DL, forming the at least one test hole b in the test region 100 in S103 includes:

forming two test holes b in the test region 100, the two test holes exposing two of the source region 61*a*, the drain region 61*b* and the gate 71 of the target thin film transistor Tg that are not directly coupled to the data lead DL.

Figure 5C:
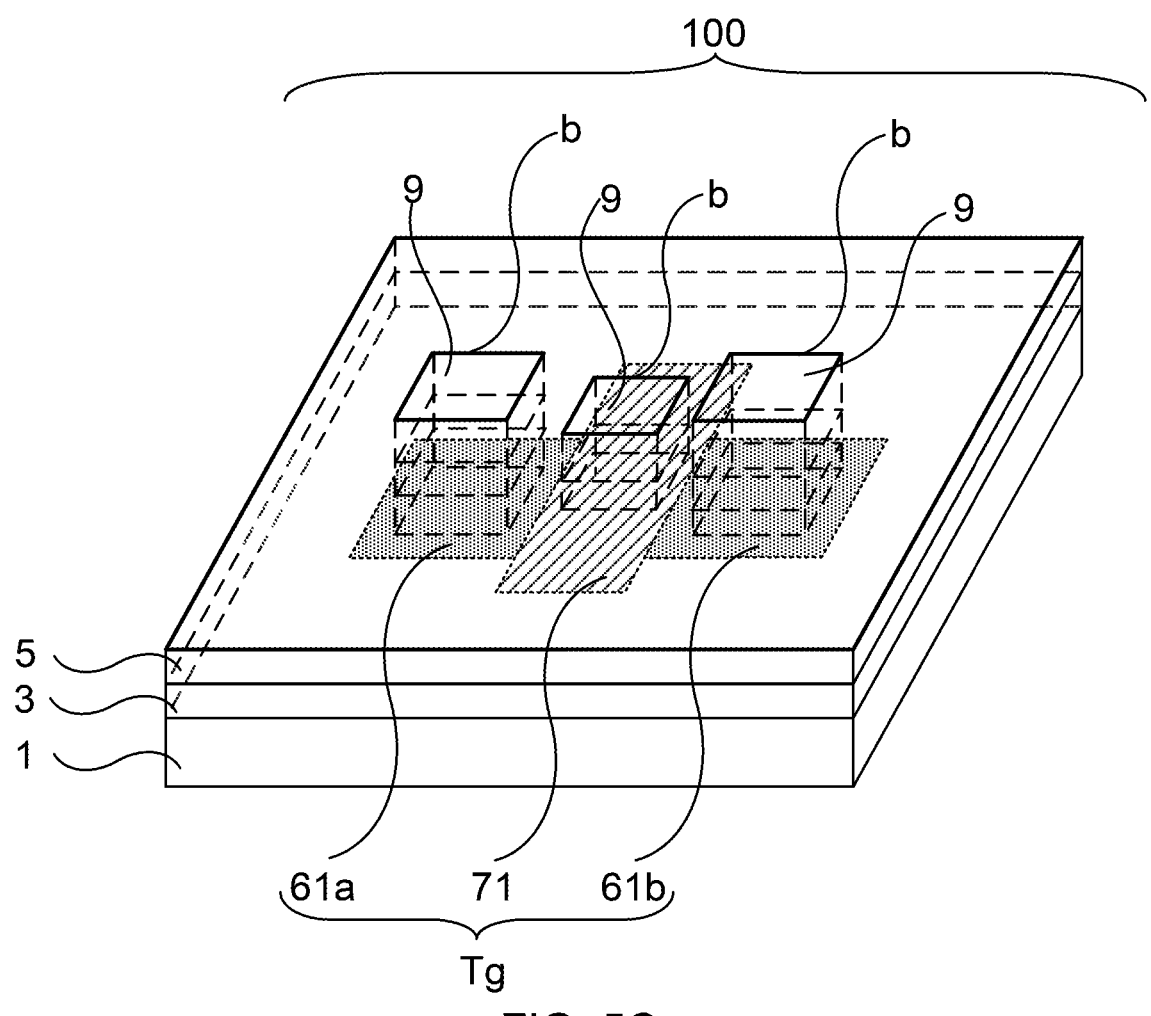
FIG. 5C is a diagram showing a structure of yet another target thin film transistor in a test substrate, in accordance with some embodiments.
Figure 6:
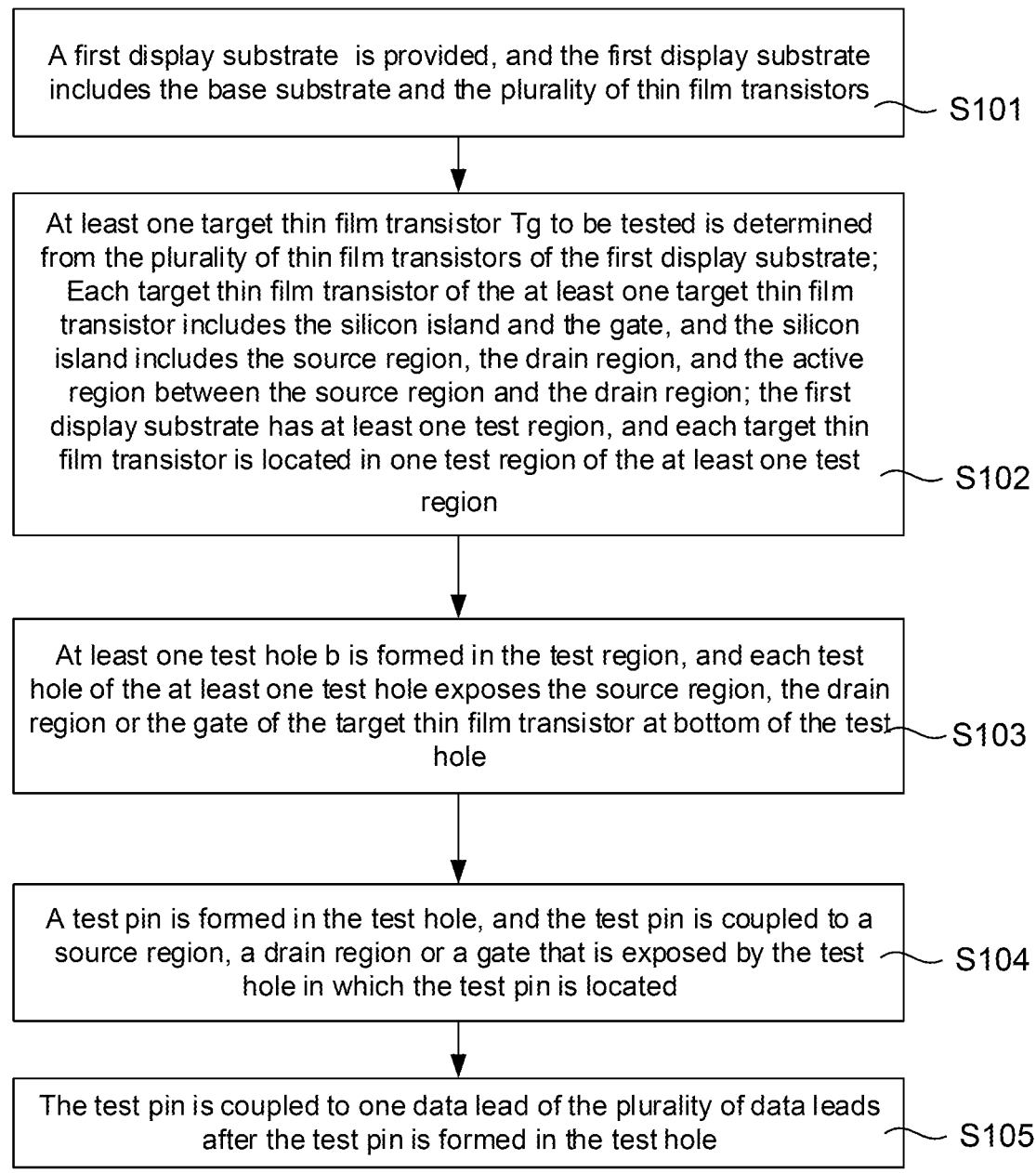
FIG. 6 is a flow diagram of another method for manufacturing a test substrate, in accordance with some embodiments.

For example, as shown in FIGS. 2, 3 and 5A (for ease of distinction, a via hole a is represented by a circular hole, and test holes b are represented by square holes in FIG. 5A, and the same is true in FIGS. 5B and 5C), taking an example in which the thin film transistor T3 is used as the target thin film transistor Tg, the gate 71 of the thin film transistor T3 is directly coupled to a data lead DL through a via hole a. A probe of a test device may be put onto the data lead DL to be in contact with it, which may allow a test voltage to be provided to the gate 71 of the thin film transistor T3. In this way, there is no need to form a test hole b at a position corresponding to the gate 71. The source region 61*a* and the drain region 61*b* of the thin film transistor T3 are not directly coupled to the data leads DL. The source region 61*a* and the drain region 61*b* are covered by a plurality of inorganic layers, e.g., the first insulating layer 3, the second insulating layer 4 and the interlayer insulating layer 5. Therefore, probes of the test device are not in direct contact with the source region 61*a* and the drain region 61*b* of the thin film transistor T3. In this case, two test holes b are formed at positions corresponding to the source region 61*a* and the drain region 61*b* of the thin film transistor T3, and the two test holes b penetrate the first insulating layer 3, the second insulating layer 4 and the interlayer insulating layer 5. The source region 61*a* and the drain region 61*b* of the thin film transistor T3 are exposed at bottoms of the two test holes b. Two test pins 9 formed in the two test holes b are coupled to the source region 61*a* and the drain region 61*b* of the thin film transistor T3. By coupling the probes of the test device to the two test pins 9, test voltages may be provided to the source region 61*a* and the drain region 61*b* of the thin film transistor T3.

In some embodiments, in a case where two of the source region 61*a*, the drain region 61*b* and the gate 71 of the target thin film transistor Tg are directly coupled to data leads DL, forming the at least one test hole b in the test region 100 in S103 includes:

forming one test hole b in the test region 100, the test hole b exposing one of the source region 61*a*, the drain region 61*b* and the gate 71 of the target thin film transistor Tg that is not directly coupled to the data leads DL.

For example, as shown in FIG. 5B, in a case where the drain region 61*b* and the gate 71 of the target thin film transistor Tg are both directly coupled to data leads DL through via holes a, respectively, the probes of the test device may be put onto the data leads DL to be in contact with it, which may allow test voltages to be provided to the drain region 61*b* and the gate 71 of the target thin film transistor Tg. In this way, there is no need to form test holes b at positions corresponding to the drain region 61*b* and the gate 71. The source region 61*a* of the target thin film transistor Tg is not directly coupled to the data leads DL. In this case, a test hole b is formed at a position corresponding to the source region 61*a* of the target thin film transistor Tg, and the source region 61*a* of the target thin film transistor Tg is exposed at a bottom of the test hole b. A test pin 9 formed in the test hole b is coupled to the source region 61*a* of the target thin film transistor Tg. By coupling the probe of the test device to the test pin 9, the test voltage may be provided to the source region 61*a* of the target thin film transistor Tg.

In some other embodiments, in a case where none of the source region 61*a*, the drain region 61*b* and the gate 71 of the target thin film transistor Tg are directly coupled to data leads DL, forming the at least one test hole b in the test region 100 in S103 includes:

forming three test holes b in the test region 100, the three test holes b exposing the source region 61*a*, the drain region 61*b* and the gate 71 of the target thin film transistor Tg.

For example, as shown in FIG. 5C, in a case where none of the gate 71, the source region 61*a* and the drain region 61*b* of the target thin film transistor Tg are directly coupled to the data leads DL, three test holes b are formed at positions corresponding to the gate 71, the source region 61*a* and the drain region 61*b* of the target thin film transistor Tg. The three test holes b respectively expose the source region 61*a*, the drain region 61*b* and the gate 71 of the target thin film transistor Tg, and three test pins 9 formed in the three test holes b are coupled to the source region 61*a*, the drain region 61*b* and the gate 71 of the target thin film transistor Tg, respectively. By coupling the probes of the test device to the three test pins 9, test voltages may be provided to the source region 61*a*, the drain region 61*b* and gate 71 of the target thin film transistor Tg.

In summary, in the test substrate obtained by using the manufacturing method provided by some embodiments of the present disclosure, the source region 61*a*, the drain region 61*b* or the gate 71 of the target thin film transistor Tg that is located in the test region 100 may be exposed by the test hole b. Then, a test pin 9 is formed in the test hole b, and the test pin 9 may be coupled to a source region 61*a*, a drain region 61*b* or a gate 71 that is exposed at a bottom of the test hole b.

In this way, by directly coupling the probe of the test device to the test pin 9, the test voltage may be provided to at least one of the source region 61*a*, the drain region 61*b* or the gate 71 of the target thin film transistor Tg, so as to directly test the electrical characteristics of the target thin film transistor Tg.

In this case, regardless of whether the target thin film transistor Tg is located in the active area, or the non-active area that is located on the periphery of the active area, the test device may directly test the electrical characteristics of the target thin film transistor Tg. Therefore, the electrical characteristics of the target thin film transistor Tg may be accurately obtained, and there is no need to characterize the electrical characteristics of the defective thin film transistors by using the electrical characteristics of the test units located on the periphery of the active area, thereby achieving a purpose of improving accuracy of the electrical test. Further, according to the electrical characteristics of the target thin film transistor Tg obtained through the test, in the subsequent processes of manufacturing the display substrates, a manufacturing process of a corresponding thin film transistor in the display substrate may be guided and improved, and the electrical characteristics of the corresponding thin film transistor may be improved, thereby achieving the purpose of improving the product yield.

In some embodiments, as shown in FIGS. 6 and 7A to 7C the method for manufacturing the test substrate further includes S105: coupling the test pin 9 to one data lead DL of the plurality of data leads DL after the test pin 9 is formed in the test hole b. The data lead DL is adjacent to the test pin 9, and is not directly coupled to any one of the source region 61*a*, the drain region 61*b* and the gate 71 of the target thin film transistor Tg corresponding to the test pin 9.

For example, in a case where the target thin film transistor Tg is the thin film transistor T4, as shown in FIGS. 2 and 3, in the first display substrate 01 the drain region 61*b* of the thin film transistor T4 is directly coupled to a data lead DL (the data lead DL being a data line) through a via hole a. Two test holes b and two test pins 9 are formed at positions corresponding to the source region 61*a* and the gate 71 of the thin film transistor T4. A test pin 9 corresponding to the gate 71 is coupled to an adjacent data lead DL, and the data lead DL cannot be the data lead DL that is coupled to the drain region 61*b* of the thin film transistor T4 through the via hole a. A test pin 9 corresponding to the source region 61*a* is coupled to an adjacent data lead DL, and the data lead DL cannot be the data lead DL that is coupled to the drain region 61*b* or the gate 71 of the thin film transistor 14. That is to say, a source region 61*a*, a drain region 61*b* and a gate 71 of a same target thin film transistor Tg are coupled to different data leads DL, so as to avoid a problem that test voltages applied to the source region 61*a*, the drain region 61*b* and the gate 71 of the same target thin film transistor Tg interfere with each other, which may affect an effect of the test.

For example, as shown in FIGS. 7A to 7G, in a case where the test pin 9 is formed through a deposition process, after the test pin 9 is formed in the test hole b, the deposition process is continued, so that the formed test pin 9 is coupled to a data lead DL adjacent to the test pin 9 through the subsequently deposited metal.

In this case, by connecting the test pin 9 to the adjacent data lead DL, when the electrical characteristics are tested, the probe of the test device may be in direct contact with the data lead DL. That is, the test voltage may be provided to the test pin 9 coupled to the data lead DL, and then the test voltage is provided to the source region 61*a*, the drain region 61*b* or the gate 71 to which the test pin 9 is coupled, so as to implement an electrical characteristics test on the target thin film transistor Tg. Since a size of the data lead DL is greater than a size of the test pin 9, the probes of the test device may be easy to be in contact with the data leads DL, which may make test operation simple and easy.

In the first display substrate 01, as shown in FIG. 2, a plurality of thin film layers are disposed at the first side of the base substrate 1, and the plurality of thin film layers form the plurality of thin film transistors. The plurality of thin film layers include at least one conductive thin film layer. In some embodiments, each thin film layer of the at least one conductive thin film layer is severed around the test region 100, so that the test region 100 is electrically separated from other regions. The other regions include other test regions 100 in the at least one test region 100 other than the test region 100, and a non-test region 100 in the display substrate other than the at least one test region 100.

For example, as shown in FIG. 2, the plurality of thin film layers are the semiconductor layer 6, the first insulating layer 3, the first metal layer 7, the second insulating layer 4, the second electrode layer 8 and the interlayer insulating layer 5 that are sequentially stacked on the first side of the base substrate 5. The at least one conductive thin film layer includes the semiconductor layer 6, the first metal layer 7 and the second electrode layer 8. Each thin film layer of the at least one conductive thin film layer is severed around the test region 100, so that the test region 100 may be electrically separated from other regions. In this way, during the electrical characteristics test on the target thin film transistor Tg in the test region 100, it is possible to avoid that since the test region 100 is coupled to other regions through the at least one conductive thin film layers, a voltage output by the test device is not fully applied to the source region 61a, the drain region 61b or the gate 71 of the target thin film transistor Tg, thereby affecting an effect of the test.

Figure 14:
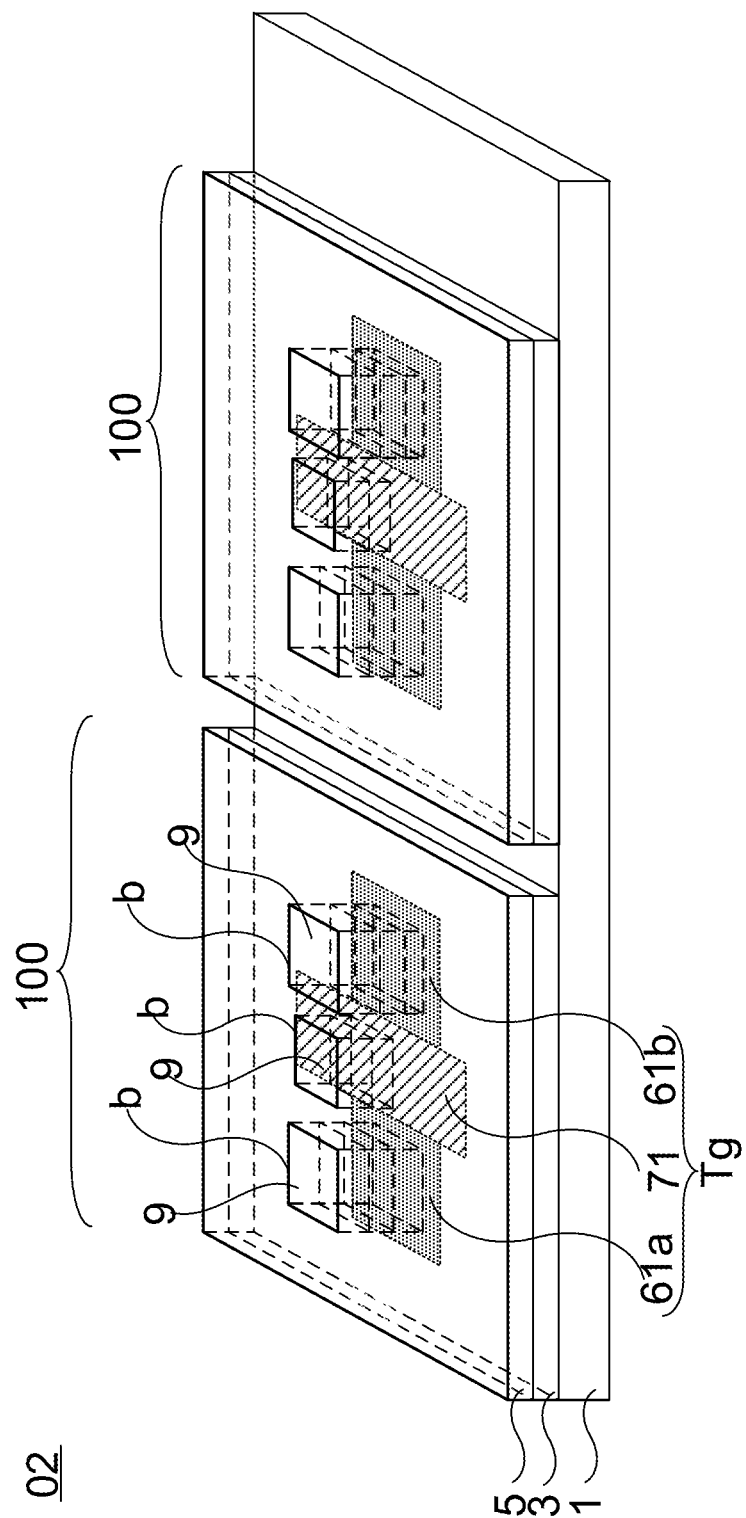
FIG. 14 is a diagram showing a structure of another test substrate, in accordance with some embodiments.

In some examples, as shown in FIG. 14, in a case where two test regions 100 are adjacent, for example, in a case where the thin film transistor T3 and the thin film transistor T4 are both target thin film transistors Tg, test regions 100 corresponding to the two target thin film transistors Tg are adjacent. The method for manufacturing the test substrate further includes severing conductive thin film layers in the two adjacent test regions 100. For example, a plurality of thin film layers stacked in sequence are severed at an interface of the two adjacent test regions 100. In this way, it is possible to avoid that a test result is affected due to a coupling between the conductive thin film layers of the two adjacent test regions 100 during the electrical test.

For example, in a direction perpendicular to a film-forming surface of the base substrate 1, thin film layers such as the data lead layer 2, the interlayer insulating layer 5, the second electrode layer 8, the second insulating layer, the first metal layer 7 and the first insulating layer shown in FIG. 2 are severed by using a focused ion beam (FIB) sputtering process from top to bottom.

In some embodiments, forming the at least one test hole b in the test region 100 in S103 includes:

by using the focused ion beam sputtering process, performing the sputtering process at a position corresponding to at least one of the source region, the drain region and the gate 71 of each target thin film transistor Tg according to at least one sputtering calculation model, to form the at least one test hole b.

In some examples, in the focused ion beam sputtering process, a very high voltage is applied to an ion beam emitted by a liquid metal (e.g., Ga) ion source, so that the ion beam obtains energy. The focused ion beam that obtains the energy can bombard the surface of the substrate to be sputtered according to a sputtering pattern in the at least one sputtering calculation model. Thus, a test hole b having a preset sputtering pattern is formed in the first display substrate 01.

FIGS. 5A to 5C show an example in which the sputtering pattern of the test hole b has a rectangular shape. The sputtering pattern of the test hole b may also have a circular shape or any shape.

It will be noted that, parameters of each sputtering calculation model of the at least one sputtering calculation model include a shape and a size of an opening of a test hole b to be formed, a depth of the test hole b to be formed, and a voltage and/or a current applied to the ion beam.

For example, the voltage or the current applied to the ion beam can determine a sputtering rate of the ion beam. The higher the voltage applied to the ion beam is, the more energy the ion beam obtains, and the larger the current applied to the ion beam is, the larger the number of ions in the ion beam is, thereby making the sputtering rate of the ion beam high, and vice versa. In this case, in a focused ion beam sputtering process, a relationship between the sputtering rate and a sputtering depth and a relationship between the sputtering rate and the size of the opening of the test hole b may be determined by using the sputtering calculation model, so as to precisely control the size of the opening and the depth of the test hole b.

In addition, in a process of forming the test hole b by using the focused ion beam sputtering process, the number of the sputtering calculation models may be increased to obtain a good sputtering effect and uniform sputtering depths of the test holes b. For example, two sputtering calculation models are used, and the sputtering calculation models are superimposed on each other to obtain a good sputtering effect.

In a case where at least two sputtering calculation models are used, openings of the test holes b in the two models should have a same size and a same shape. For example, the openings of the test holes both have a rectangular shape shown in FIG. 5C.

In addition, in the sputtering process, a sputtering position and the sputtering rate may be adjusted in real time according to flatness of the bottom of the test hole b, so as to ensure uniformity of the sputtering.

Figure 9:
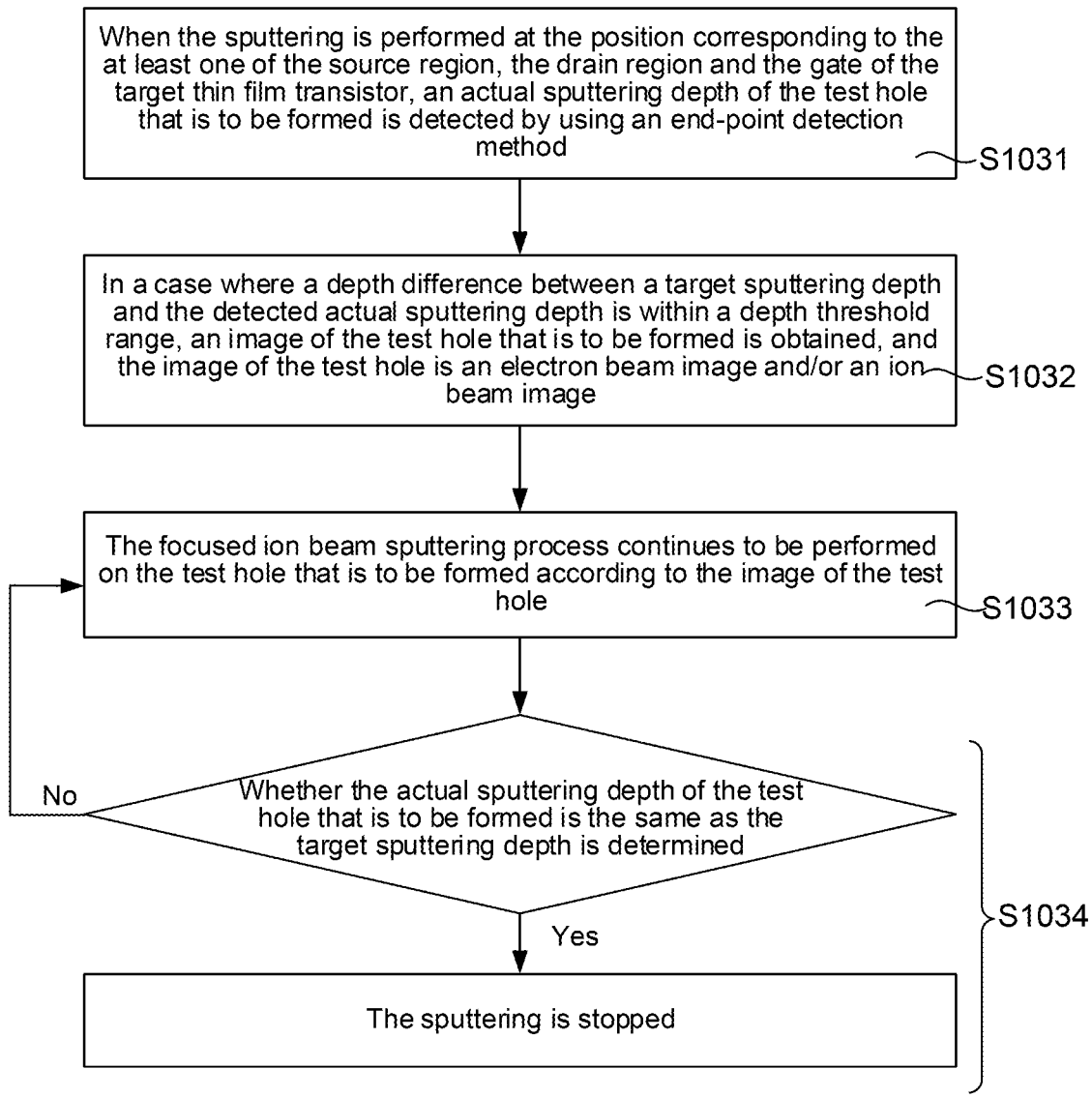
FIG. 9 is a flow diagram of yet another method for manufacturing a test substrate, in accordance with some embodiments.

On this basis, as shown in FIG. 9, in order to obtain the flatness of the bottom of the test hole b, forming the at least one test hole b in the test region 100 in S103 further includes S1031 to S1034.

In S1031, when the sputtering is performed at the position corresponding to the at least one of the source region 61a, the drain region 61b and the gate 71 of the target thin film transistor Tg, an actual sputtering depth of the test hole b to be formed is detected by using an end-point detection method.

In S1032, in a case where a depth difference ΔH between a target sputtering depth H and the detected actual sputtering depth Ha (i.e., ΔH=H−Ha) is within a depth threshold range, it may be proved that the actual sputtering depth of the test hole b has roughly reached the target depth H.

In this case, an image of the test hole b to be formed is obtained, and the image of the test hole b is an electron beam image and/or an ion beam image.

In some examples, in the focused ion beam sputtering process, the ion beam image may be obtained simultaneously through ion beam imaging, and the electron beam image may be obtained through a high-precision electron microscope.

In S1033, the focused ion beam sputtering process continues to be performed on the test hole b to be formed according to the image of the test hole b. In S1034, the focused ion beam sputtering process continues to be performed until the actual sputtering depth of the test hole b to be formed is the same as the target depth H.

It will be noted that, the description that the actual sputtering depth of the test hole b is the same as the target sputtering depth H means that an absolute value of a difference between the actual sputtering depth and the target sputtering depth H of the test hole b is within a manufacturing error range of the sputtering process.

In the above embodiments, on one hand, the test hole b is roughly sputtered to the target sputtering depth H through the focused ion beam sputtering process by using the end-point detection method, so as to increase a rate of forming the test hole b.

On another hand, in the case where the depth difference ΔH between the target sputtering depth H and the detected actual sputtering depth Ha (i.e., ΔH=H−Ha) is within the threshold depth range, in a process of continuing the focused ion beam sputtering process, the image of the test hole b to be formed is obtained in real time. The actual sputtering depth of the test hole b is precisely determined according to the ion beam image and/or the electron beam image, so that the actual sputtering depth of the test hole b may be equal to the target sputtering depth H within an allowable range of a sputtering tolerance, thereby achieving a purpose of improving a sputtering accuracy of the test hole b.

In some embodiments, the test pin 9 may be formed in the test hole b by using a deposition process in S104, such as a focused ion beam deposition process. This step includes: forming the test pin 9 by depositing a metal in the test hole b through the focused ion beam deposition process.

In some examples, an organic gas containing a metal to be deposited (e.g., platinum (Pt) or tungsten (W)) is sprayed into the test hole b with a gas spray. The ion source emits a focused ion beam. The organic gas is decomposed under bombardment of the focused ion beam. Metal ions in the organic gas form atoms after obtaining electrons, and the atoms are deposited in the test hole b to form the test pin 9.

A material of the test pin 9 is not limited, as long as the material is capable of conducting electricity. For example, the test pin 9 is made of tungsten. Since tungsten has a small resistivity and a good conductivity, the accuracy of testing the electrical characteristics of the target thin film transistor Tg may be improved.

In some other embodiments, the test pin 9 may also be formed in the test hole b by using a sputtering process in S104. In a vacuum environment, an appropriate inert gas is introduced as a medium. The inert gas is accelerated to bombard a target material, so that atoms on a surface of the target material is bombarded off to form a coating film in the test hole b, and the coating film is the test pin 9.

Or, in yet some other embodiments of the present disclosure, the test pin 9 may also be formed in the test hole b by using a chemical vapor deposition process in S104. Under catalysis of laser, fixed-point deposition is implemented in the test hole b to form the test pin 9.

On a basis of some embodiments in which the test pin 9 is formed in the test hole b, the method for manufacturing the test substrate provided by some embodiments of the present disclosure further includes: removing residual metal 300 deposited around the test hole b after the test pin 9 is formed in the test hole b.

Figure 8A:
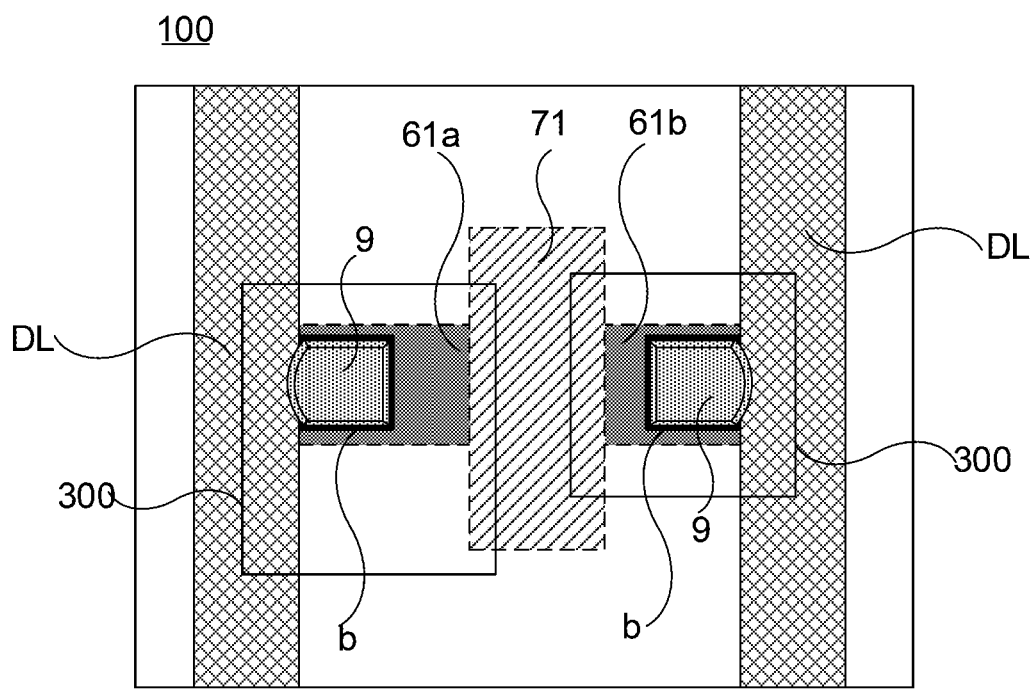
FIG. 8A is a diagram showing a structure of yet another test region in a test substrate, in accordance with some embodiments.
Figure 8B:
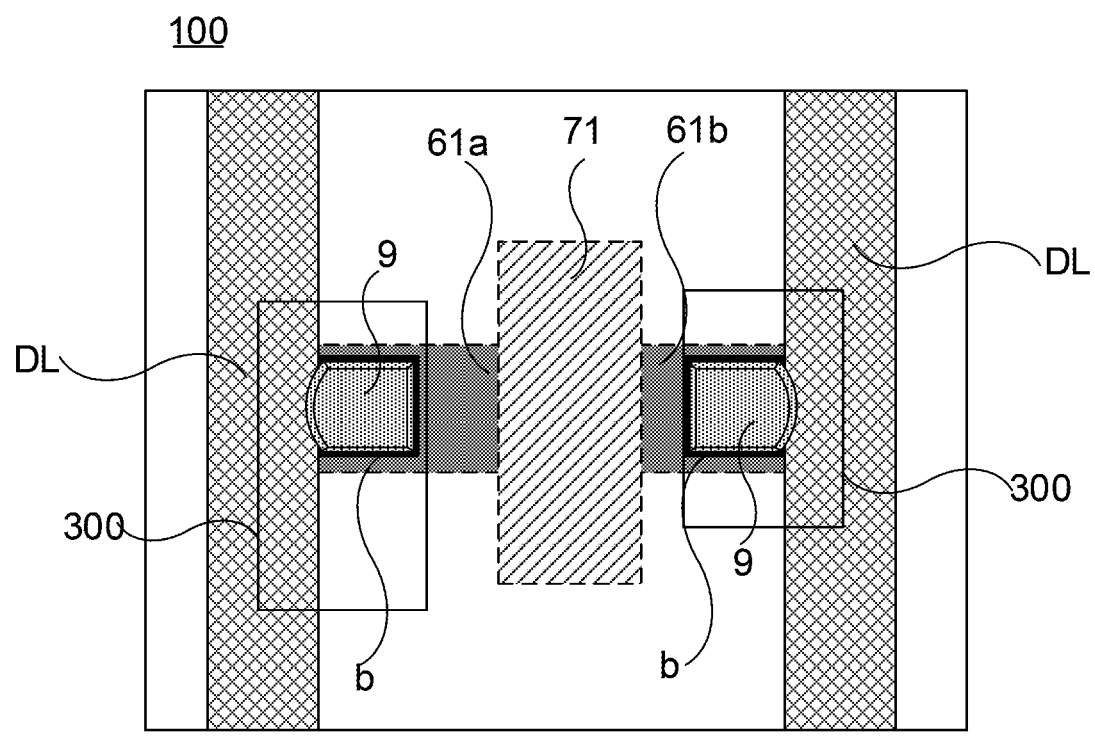
FIG. 8B is a diagram showing a structure of yet another test region in a test substrate, in accordance with some embodiments.

For example, referring to FIGS. 8A and 8B, in the process of forming the test hole b by using the focused ion beam sputtering process, a periphery of the test hole b is covered with the residual metal 300 formed by a metal material of a sputtered substrate in the sputtering process. Or, after the metal is deposited in the test hole b by using the focused ion beam deposition process to form the test pin 9, the periphery of the test hole b or a periphery of the test pin 9 is covered with the residual metal 300 made of a same material as the formed test pin 9.

As shown in FIG. 8A, in a process of forming test pins 9 corresponding to the source region 61a and the drain region 61b of the target thin film transistor Tg, or in a process of coupling a test pin 9 to a data lead DL, the residual metal 300 may be deposited and in contact with nearby data leads DL, e.g., a data lead DL to which the gate 71 is coupled. Since the residual metal 300 is conductive, there is a risk of short circuit during the test. Removing the residual metal 300 may reduce the risk of short circuit between the test pin 9 and the nearby data leads DL due to the contact between the residual metal 300 and the nearby data leads DL.

Figure 10:
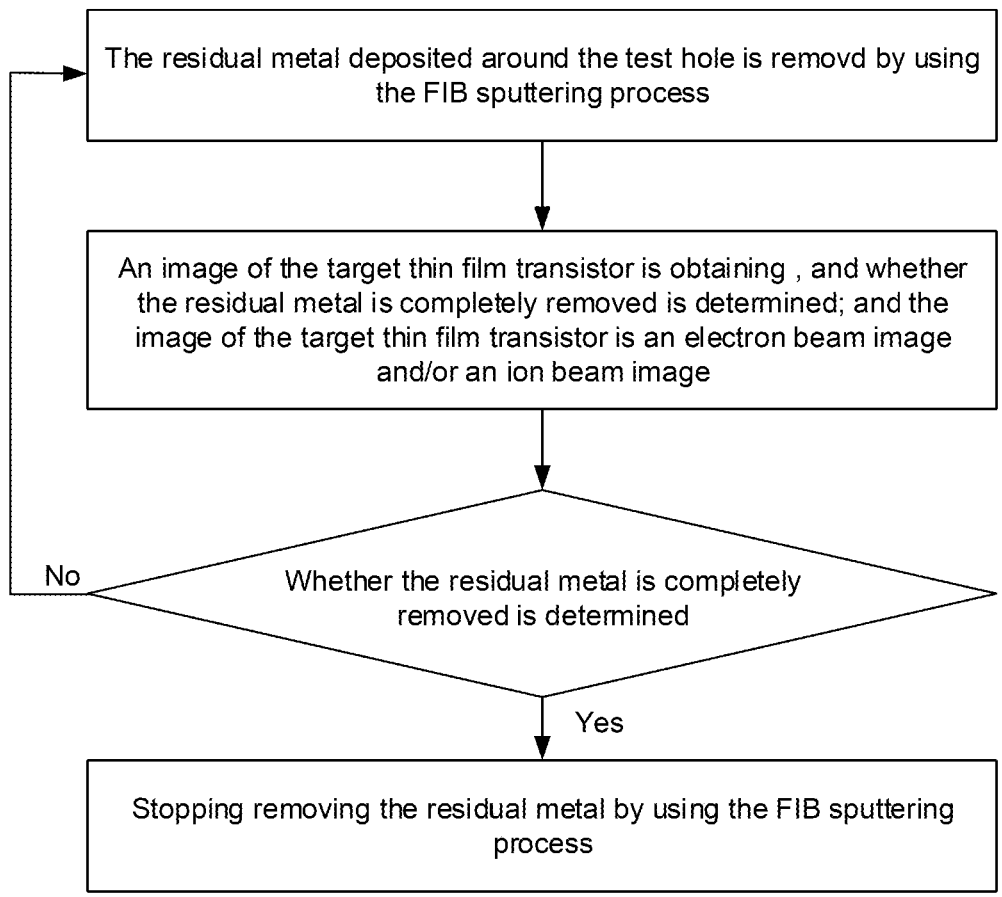
FIG. 10 is a flow diagram of yet another method for manufacturing a test substrate, in accordance with some embodiments.

In some embodiments, as shown in. FIG. 10, removing the residual metal 300 around the test hole b includes the following steps.

The residual metal 300 deposited around the test hole b is removed by using the focused ion beam sputtering process. For example, the focused ion beam sputtering process is used, and an etching gas including xenon difluoride (XeF2) is used to react with the residual metal 300, so that the residual metal 300 is etched.

An image of the target thin film transistor Tg is obtained, and it is determined that whether the residual metal 300 is completely removed. The image of the target thin film transistor Tg is an electron beam image and/or an ion beam image.

If the residual metal 300 is not completely removed, the residual metal 300 continues to be removed by using the focused ion beam sputtering process. If the residual metal 300 is completely removed, the focused ion beam sputtering process is stopped.

Removal effect of the residual metal 300 may be obtained through the electron beam image and/or the ion beam image of the target thin film transistor Tg, so that the residual metal 300 is removed according to a determination result until the residual metal 300 is completely removed.

FIG. 8A or FIG. 8B shows an example of the image (the ion beam image and/or the electron beam image) of the target thin film transistor Tg. By observing the ion beam image and/or the electron beam image, it is determined whether the residual metal 300 is completely removed.

For example, it will be seen from FIGS. 8A and 8B that, the residual metal 300 in FIG. 8B is reduced relative to the residual metal 300 in FIG. 8A, but it is not completely removed. Therefore, there is a need to continue removing the residual metal 300 by using the focused ion beam sputtering process until the residual metal 300 is completely removed.

Figure 7A:
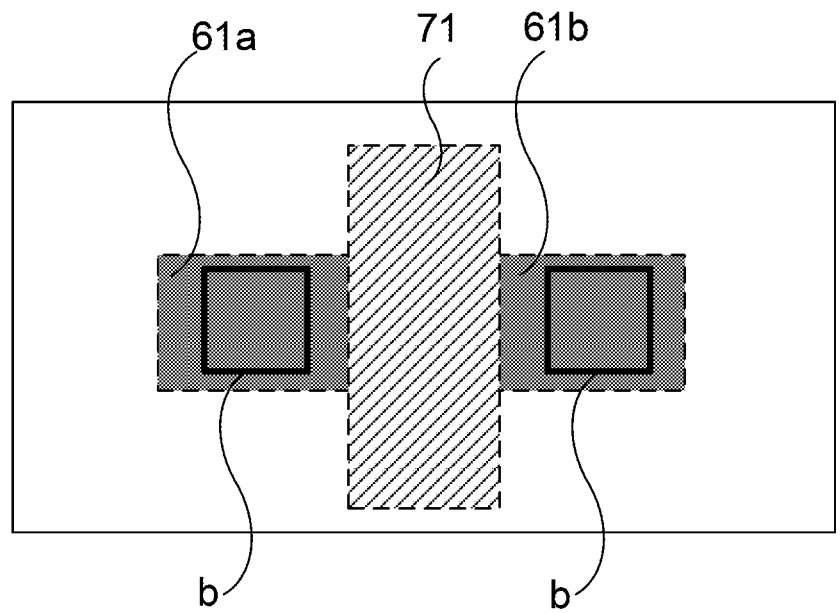
FIG. 7A is a diagram showing a structure of a test region in a test substrate, in accordance with some embodiments.
Figure 7B:
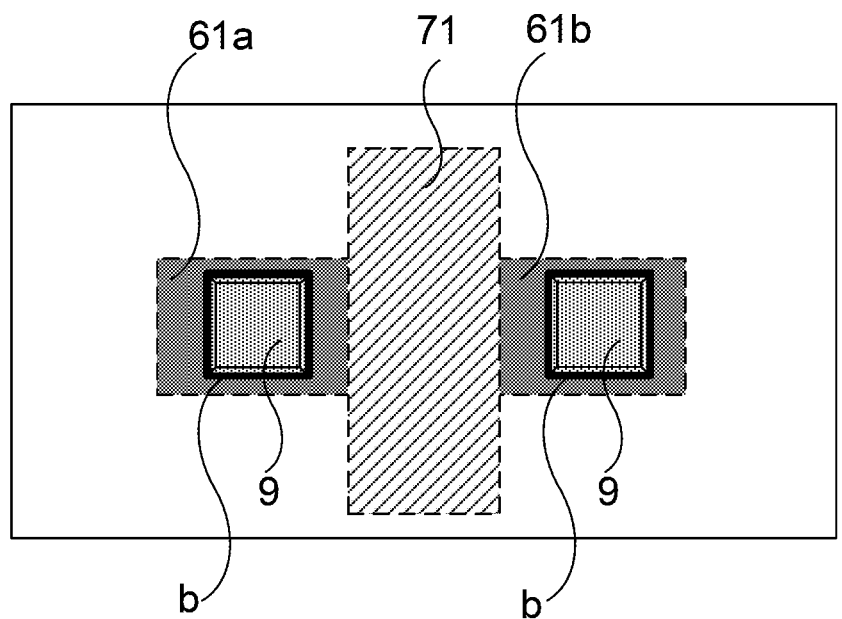
FIG. 7B is a diagram showing a structure of another test region in a test substrate, in accordance with some embodiments.
Figure 7C:
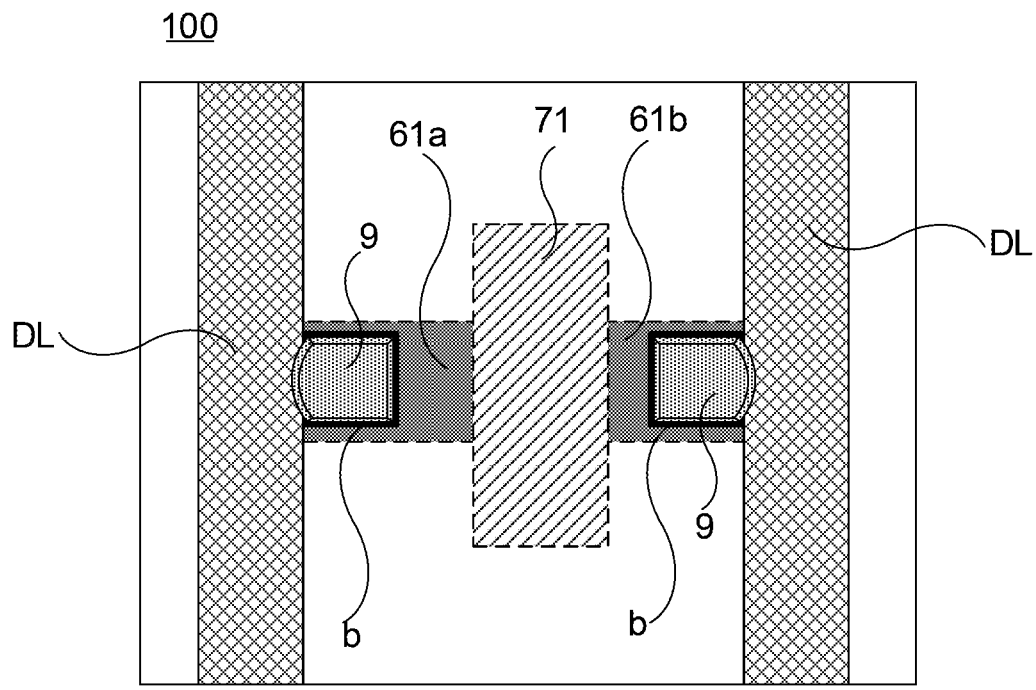
FIG. 7C is a diagram showing a structure of yet another test region in a test substrate, in accordance with some embodiments.

In some embodiments, an orthographic projection of the test pin 9 on the base substrate 1 of the display substrate 01 is within an orthographic projection of the source region 61a, the drain region 81b or the gate 71 of the target thin film transistor Tg to which the test pin 9 is coupled on the base substrate 1. That is to say, as shown in FIG. 7B, the test hole b only exposes the source region, the drain region or the gate 71 of the target thin film transistor Tg, and does not expose other thin film layers around the source region 61a, the drain region 61b or the gate 71.

In this way, there are no other thin film layers that are located in different layers from the source region, the drain region or the gate 71 at the bottom of the test hole b, thereby preventing a step between film layers from forming at the bottom of the test hole b and preventing the step from affecting the flatness of the bottom of the test hole b. In a case where the bottom of the test hole b has a good flatness, the test pin 9 formed in the test hole b in S103 may be in good contact with the source region 61a, the drain region 61b or the gate 71 that is exposed at the bottom of the test hole b, which is advantageous for improving the effect of the test on the target thin film transistor Tg.

In some examples, in a case where the at least one test hole b is formed by using the focused ion beam sputtering process according to the at least one sputtering calculation model, when the sputtering calculation model is established, the size of the opening of the test hole b in the sputtering calculation model is less than a size of the source region 61a, the drain region 61b or the gate 71 to be exposed by the test hole b.

For example, in a case where the opening of the test hole b is in a shape of a rectangle, a length of any side of the rectangle is less than or equal to a line width of the source region, the drain region or the gate 71 of the target thin film transistor Tg. Or, in a case where the opening of the test hole b is in a shape of a circle, a diameter of the circle is less than or equal to the line width of the source region, the drain region 61b or the gate 71 of the target thin film transistor Tg.

Figure 11:
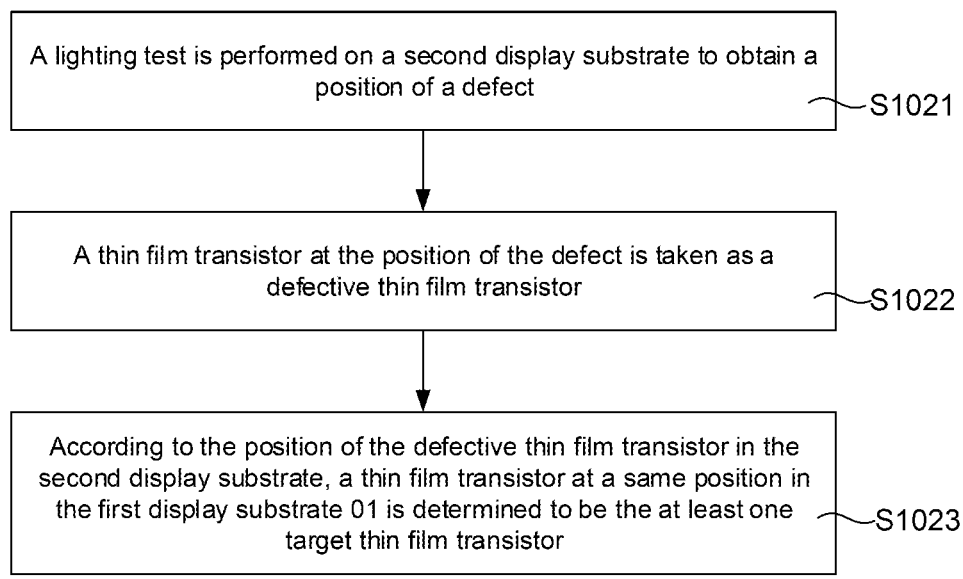
FIG. 11 is a flow diagram of yet another method for manufacturing a test substrate, in accordance with some embodiments.

In some embodiments, as shown in FIG. 11, determining the at least one target thin film transistor Tg to be tested from the plurality of thin film transistors in the first display substrate 01 in S102 includes S1021 to S1023.

In S1021, a lighting test is performed on a second display substrate to obtain a position of a defect. The second display substrate includes a plurality of thin film transistors. The number, structures and positions of the plurality of thin film transistors in the second display substrate are correspondingly the same as the number, structures and positions of the plurality of thin film transistors in the first display substrate 01.

It will be noted that, partial structures of the second display substrate are the same as those of the first display substrate 01. For example, the second display substrate and the first display substrate 01 belong to a same production batch. The second display substrate includes a base substrate 1, a data lead layer 2, and a plurality of thin film layers between the base substrate 1 and the data lead layer 2. A structure of the second display substrate is the same as the structure of the first display substrate 01. In addition, the second display substrate further includes thin film layers such as a passivation layer, an anode layer, a light-emitting layer and a cathode layer that are sequentially stacked on a side of the data lead layer 2 away from the base substrate 1. The first display substrate 01 is a complete display substrate, which can support the lighting test to be performed to obtain the position of the defect (e.g., a position of a bright spot).

In S1022, a thin film transistor at the position of the defect is taken as a defective thin film transistor.

In S1023, according to the position of the defective thin film transistor in the second display substrate, a thin film transistor at a same position in the first display substrate 01 is determined to be one of the at least one target thin film transistor Tg.

In the above embodiments, by performing the lighting test on the second display substrate, the at least one target thin film transistor Tg is determined according to the position of the defect and corresponding positional relationships between thin film transistors in the first display substrate 01 and the thin film transistors in the second display substrate. The base substrate 1, the data lead layer 2, and the plurality of thin film layers between the base substrate 1 and the data lead layer 2 in the second display substrate correspondingly have same structures as that in the first display substrate 01. That is, the positions of the plurality of thin film transistors included in the second display substrate each correspond to a respective one of the positions of the plurality of thin film transistors included in the first display substrate 01. Therefore, the obtained position of the defect in the second display substrate is capable of reflecting a position of a defective thin film transistor in the first display substrate 01, and the defective thin film transistor is determined as the target thin film transistor Tg. As a result, the determination of the target thin film transistor Tg may be accurate and targeted, and the electrical characteristics test may be performed on the target thin film transistor Tg.

The step of providing the first display substrate 01 in S101 includes a step of manufacturing the first display substrate 01. The method for manufacturing the first display substrate 01 will be described below by taking the first display substrate 01 shown in a figure as an example. It will be noted that the thin film transistor T3 and the capacitor C are taken as examples in FIGS. 12A to 12G, and as for processes of forming other thin film transistors, reference may be made to a process of forming the thin film transistor T3.

Figure 12A:
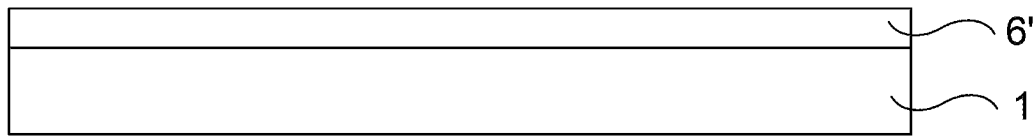
FIGS. 12A to 12G are diagrams showing steps of a method for manufacturing a first display substrate, in accordance with some embodiments.

As shown in FIG. 12A, the semiconductor layer 6' is formed on the base substrate 1.

Figure 12B:
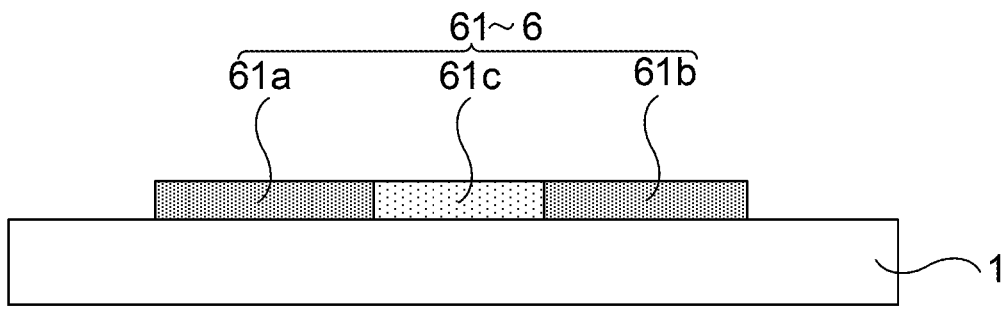

As shown in FIG. 12B, the semiconductor layer 6' is formed into a plurality of silicon islands 61 by using a patterning process. Then, an ion doping process is used, so that each silicon island 61 of the plurality of silicon islands 61 includes a source region 61a, a drain region 61b, and an active region 61c between the source region 61a and the drain region 61b.

For example, a material of the semiconductor layer 6 includes low temperature poly-silicon (LIPS). In the ion doping process, the active region of each silicon island 61 is lightly doped with ions, so that the active region becomes a lightly ion-doped region. The source region 61a and the drain region 61b of each silicon island 61 are heavily doped with ions, so that the source region 61a and the drain region 61b become heavily doped-ion regions.

It will be seen from FIGS. 2 and 3 that, a source region 61a (or a drain region 61b) of a thin film transistor may be coupled to a drain region 61b (or a source region 61a) of another thin film transistor. For example, the drain region 61b of the thin film transistor 13 is coupled to the source region 61a of the thin film transistor T4.

In this case, when the patterning process and the ion doping process are performed on the semiconductor layer 6, silicon islands 61 of thin film transistors whose source regions 61a (or drain regions 61b) are coupled to each other are formed into a one-piece structure. The ion doping process is performed on the active region 61c, the source region 61a and the drain region 61b of the silicon island 61 corresponding to each thin film transistor, so that the thin film transistors are coupled through the semiconductor layer 6.

It will be noted that, in some embodiments of the present disclosure, the patterning process may include a photoetching process, or a photoetching process and an etching process, or other processes for forming a preset pattern such as a printing process and an inkjet process. The photoetching process refers to a process of forming a pattern by using a photoresist, a mask and an exposure machine, which includes processes such as film formation, exposure and development. A corresponding patterning process may be selected according to structures to be formed.

A patterning process in some embodiments of the present disclosure is described by taking an example in which different exposure regions are formed through a masking and exposure process, and then removal processes such as an etching process and an ashing process are performed on the different exposure regions for a plurality of times to finally obtain a preset pattern.

Figure 12C:
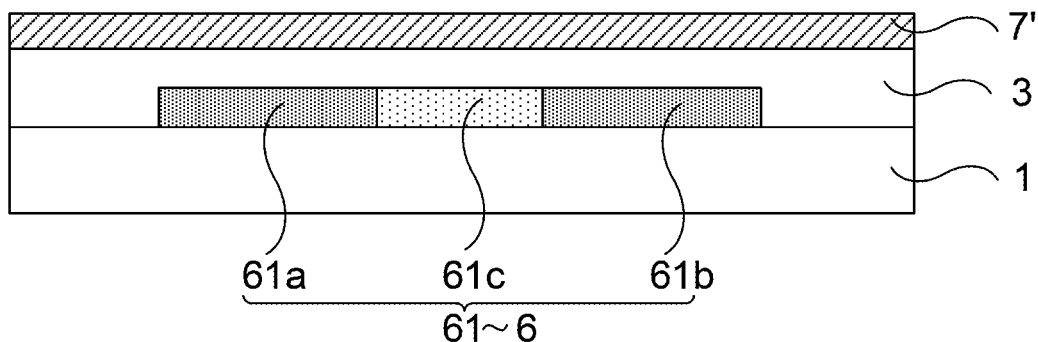

As shown in FIG. 12C, the first insulating layer 3 is formed on a side of the plurality of silicon islands 61 away from the base substrate 1. For example, a material of the first insulating layer 3 includes silicon oxide.

The first metal layer 7' is formed on a side of the first insulating layer away from the base substrate 1.

Figure 12D:
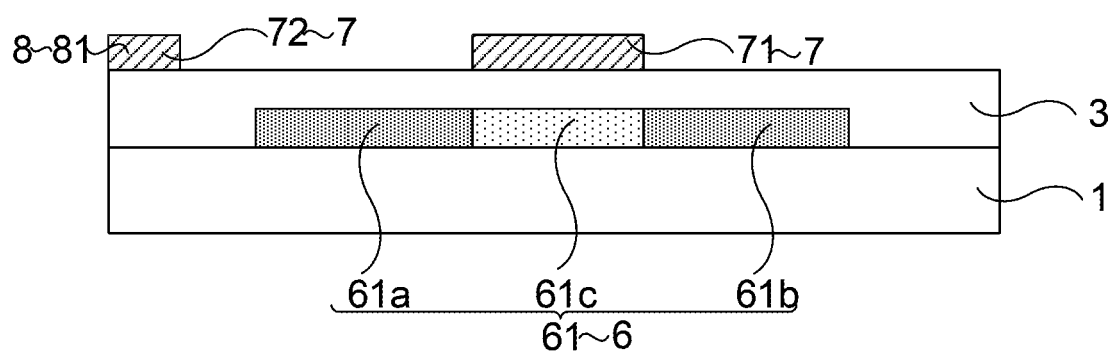

As shown in FIG. 12D, a patterning process is performed on the first metal layer T to form a plurality of gate 71 and a plurality of first electrodes 72. Each first electrode is used as the lower electrode of the capacitor.

Figure 12E:
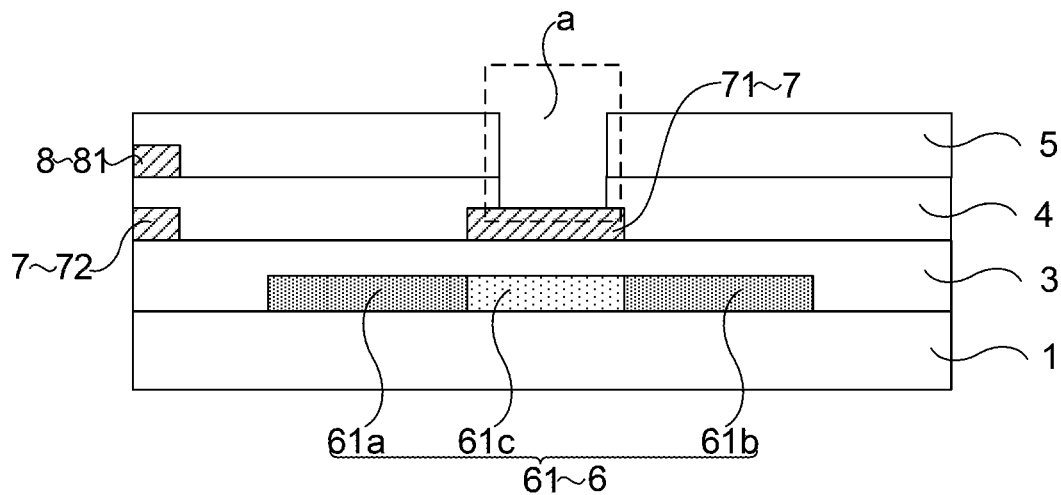

As shown in FIG. 12E, the second insulating layer 4 and a second electrode layer 8' are sequentially formed on a side of the first metal layer 7 away from the base substrate 1. In some examples, a material of the second metal layer 8' may be the same as a material of the first metal layer 7.

The patterning process is performed on the second metal layer 8' to form a plurality of second electrodes 81, and each second electrode 81 is used as the upper electrode of the capacitor. A position of each second electrode 81 corresponds to a respective one of positions of the plurality of first electrodes 72. An orthographic projection of each second electrode 81 on the base substrate 1 at least partially overlaps with an orthographic projection of a corresponding first electrode 72 on the base substrate 1, thereby forming the capacitor.

As shown in FIG. 12E, the interlayer insulating layer 5 is formed on a side of the second electrode layer 8 away from the base substrate 1. For example, a material of the interlayer insulating layer 5 includes a layer of silicon oxide and a layer of silicon nitride.

The plurality of via holes a penetrating at least the interlayer insulating layer 5 are formed through a patterning process. For example, the thin film transistor shown in FIG. 12E is the thin film transistor T3. In this step, a via hole a is formed at a position corresponding to the gate 71, and the via hole a penetrates the second insulating layer 4 and the interlayer insulating layer 5. Referring to FIG. 2, in a case where the thin film transistor is the thin film transistor T4, in this step, a via hole a is formed at a position corresponding to the drain region 61b, and the via hole a penetrates the first insulating layer 3, the second insulating layer 4 and the interlayer insulating layer 5.

Figure 12F:
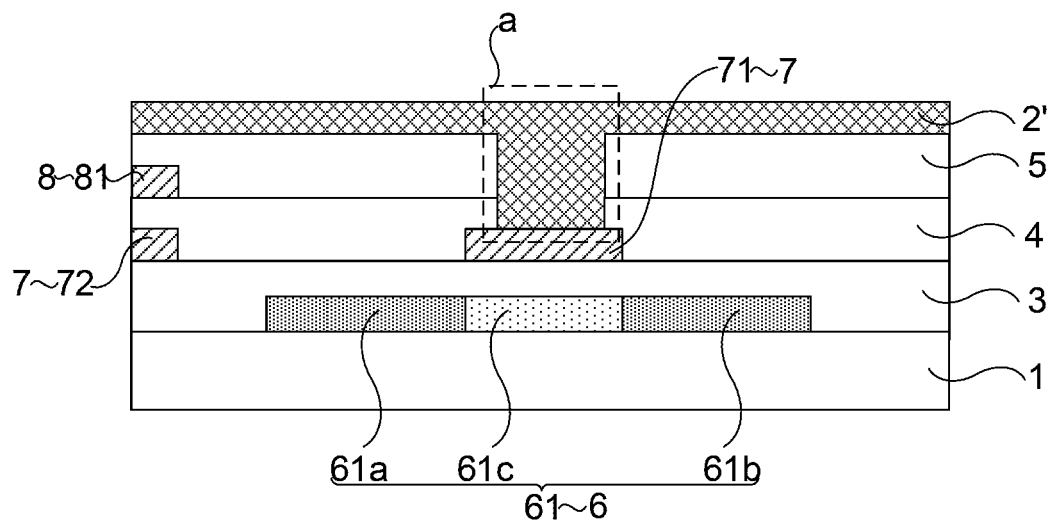

As shown in FIG. 12F, the data lead layer 2' is formed on a side of the interlayer insulating layer 5 away from the base substrate 1, and a patterning process is performed on the data lead layer 2' to form the plurality of data leads DL in the data lead layer 2. For example, the plurality of data leads DL include data lines, first voltage signal lines and connecting lines.

Figure 12G:
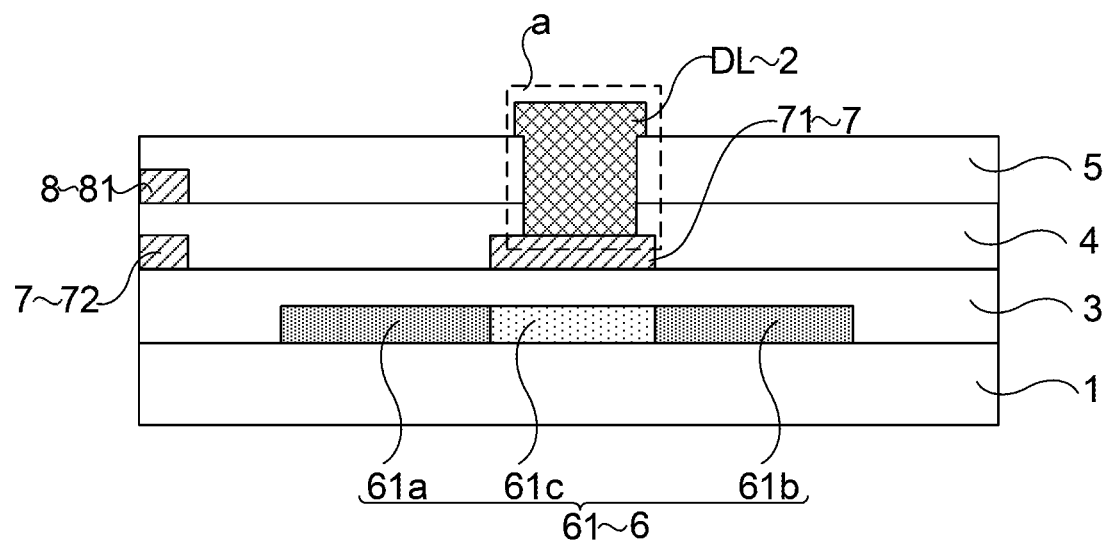

As shown in FIG. 12G, the gate 71 of the thin film transistor is coupled to a data lead DL through a via hole a.

On this basis, in addition to the target thin film transistor Tg, the test region 100 further includes other thin film layers between the target thin film transistor Tg and the base substrate 1, such as a buffer layer and a light shielding layer (not shown in figures), and portions of the plurality of thin film layers that are located in the test region 100. The plurality of thin film layers include the first insulating layer, the second insulating layer and the interlayer insulating layer 5.

It will be noted that, the method for manufacturing the test substrate is described by taking an example in which the first display substrate 01 is a display substrate having the pixel driver circuit shown in FIG. 1, In a case where the provided first display substrate 01 is a display substrate having a GOA circuit or other circuits including TFTs, the method for manufacturing the test substrate is the same as the manufacturing method described above, and details are not described herein again.

Figure 13:
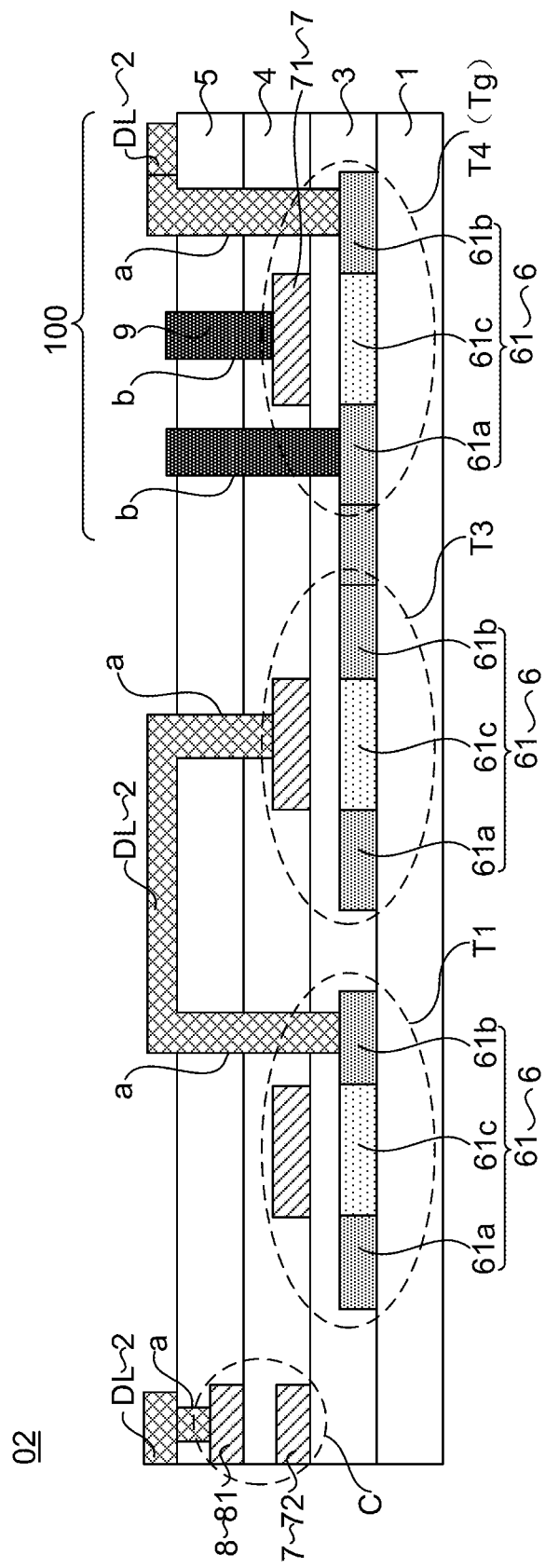
FIG. 13 is a diagram showing a structure of a test substrate, in accordance with some embodiments.

Some embodiments of the present disclosure provide a test substrate 02. As shown in FIGS. 13 and 14, the test substrate 02 includes the base substrate 1, the data lead layer 2, and a plurality of thin film layer between the base substrate 1 and the data lead layer 2.

The plurality of thin film layers are disposed on a first side of the base substrate 1, and the plurality of thin film layers form the plurality of thin film transistors. Each of the plurality of thin film transistors includes a silicon island 61 and a gate 71, and the silicon island 61 includes a source region 61a, a drain region 61b, and an active region 61c between the source region 61a and the drain region 61b.

As for a detailed description of the data lead layer 2 and the plurality of thin film layers, reference may be made to the foregoing description of the first display substrate 01, and details are not described herein again. The test substrate 02 further includes a plurality of via holes a, the plurality of via holes a are configured to couple source regions 61a, drain regions 61b or gates 71 of the thin film transistors to data leads DL. As for a detailed description of the plurality of via holes a, reference may be made to the foregoing description of the first display substrate 01, and details are not described herein again.

At least one of the plurality of thin film transistors is a target thin film transistor Tg to be tested. For example, in FIG. 13, the thin film transistor T4 is used as the target thin film transistor Tg.

The test substrate 02 has at least one test region 100, and each target thin film transistor Tg is located in one test region 100 of the at least one test region 100.

The test substrate 02 further includes at least one test hole b and at least one test pin 9 that are located in the test region 100. Each test hole b of the at least one test hole b exposes the source region 61b, the drain region 61b or the gate 71 of the target thin film transistor Tg at a bottom of the test hole. Each test pin 9 of the at least one test pin 9 is located in one test hole b of the at least one test hole b. One end of the test pin 9 passes through the test hole b to be coupled to the source region 61a, the drain region 61b or the gate 71 of the target thin film transistor Tg. The other end of the test pin 9 is exposed at a surface of the test substrate 02.

In the test substrate 02, in a process of performing an electrical characteristics test on circuit structures, a defective thin film transistor in the circuit structures may be directly used as a target thin film transistor Tg to be tested. Then, a voltage is transmitted to the source region 61a, the drain region 61b or the gate 71 to which the test pin 9 is coupled through the test pin 9, and then electrical characteristics of the target thin film transistor Tg are tested. In this way, regardless of whether thin film transistors are included in a pixel driver circuit in an active area or a gate driver circuit in a non-active area, they may be tested. Therefore, in subsequent processes of manufacturing display substrates, processes of manufacturing thin film transistors in the display substrates may be guided and improved according to the electrical characteristics of the thin film transistors obtained through the test, thereby achieving a purpose of improving a product yield.

In some embodiments, in a case where one of the source region 61a, the drain region 61b and the gate 71 of the target thin film transistor Tg is directly coupled to a data lead DL through one via hole a of the plurality of via holes a, there are two test holes b and two test pins 9 located in the two test holes b in the test region 100. The two test pins 9 are coupled to two of the source region 61a, the drain region 61b, and the gate 71 of the target thin film transistor Tg that are not directly coupled to the data lead DL through the via hole a.

For example, as shown in FIG. 5A, in a case where the gate 71 of the target thin film transistor Tg is directly coupled to the data lead DL through the via hole a, a probe of a test device may be put onto the data lead DL to be in contact with it during the test, so as to transmit a voltage to the gate 71 to which the data lead DL is coupled. The source region 61a and the drain region 61b of the target thin film transistor Tg are coupled to the two test pins 9 disposed in the two test holes b. The probes of the test device are put onto ends of the two test pins 9 that are exposed at the surface of the test substrate 02, so as to transmit voltages to the source region 61a and the drain region 61b, respectively.

In some embodiments, in a case where two of the source region 61a, the drain region 61b and the gate 71 of the target thin film transistor Tg are directly coupled to data leads DL through two of the plurality of via holes a, there is a test hole b and a test pin 9 located in the test hole b in the test region 100. The test hole b is coupled to one of the source region 61a, the drain region 61b and the gate 71 of the target thin film transistor Tg that is not directly coupled to the data leads DL through the two via holes a.

For example, as shown in FIG. 5B, in a case where the drain region 61b and the gate 71 of the target thin film transistor Tg are directly coupled to data leads DL through the two via holes a respectively, the source region 61a of the target thin film transistor Tg is coupled to the test pin 9 disposed in the test hole b. The probe of the test device may be put onto an end of the test pin 9 exposed at the surface of the test substrate 02 and be in contact with it, so as to transmit a voltage to the source region 61a.

In some other embodiments, as shown in FIG. 5C, in a case where none of the source region 61a, the drain region 61b and the gate 71 of the target thin film transistor Tg are directly coupled to data leads DL through the plurality of via holes a, there are three test holes b and three test pins 9 located in the three test holes b in the test region 100. The three test pins 9 are coupled to the source region 61a, the drain region 61b and the gate 71 of the target thin film transistor Tg.

In this way, by respectively coupling the probes of the test device to the three test pins 9, test voltages may be provided to the source region 61a, the drain region 61b and the gate 71 of the thin film transistor T5.

In some embodiments, the test pin 9 is coupled to one of the plurality of data leads DL. The data lead DL is adjacent to the test pin 9, and the source region 61a, the drain region 61b and the gate 71 of the target thin film transistor Tg are respectively coupled to different data leads DL.

In other words, one or two of the source region 61a, the drain region 61b and the gate 71 of the target thin film transistor Tg are coupled to the data lead(s) DL through the via hole(s) a, and the other two or one of the source region 61a, the drain region 61b and the gate 71 is coupled to data lead(s) DL through the test pin(s) 9 located in test hole(s) b. Or, the source region 61a, the drain region 61b and the gate 71 of the target thin film transistor Tg and coupled to three data leads DL through the three test pins 9 located in test holes b. That is, there is a need to ensure that a source region 61a, a drain region 61b and a gate 71 of a target thin film transistor Tg are coupled to three data leads DL, respectively. In this way, different voltages may be transmitted to the source region 61a, the drain region 61b and the gate 71, so as to avoid that test voltages applied to the source region 61a, the drain region 61b and the gate 71 of a same target thin film transistor Tg interfere with each other, which affects the effect of the test.

By connecting the test pin 9 to the adjacent data lead DL, when the electrical characteristics are tested, the probe of the test device may be in direct contact with the data lead DL. That is, the test voltage may be provided to the test pin 9 that is coupled to the data lead DL, so that the test voltage is provided to the source region 61a, the drain region 61b or the gate 71 to which the test pin 9 is coupled, and the electrical characteristics of the target thin film transistor Tg are tested. Since a size of the data lead DL is greater than a size of the test pin 9, the probe of the test device is easy to be in contact with the data lead DL, which makes operation of the test simple and easy.

In the first display substrate 01, as shown in FIGS. 13 and 14, a plurality of thin film layer are disposed on the first side of the base substrate 1, and the plurality of thin film transistors are formed by the plurality of thin film layer that include at least one conductive thin film layer. In some embodiments, each thin film layer of the at least one conductive thin film layer is severed around the test region 100, so that the test region 100 is electrically separated from other regions. The other regions include other test regions 100 other than the above test region 100 in the at least one test region 100, and a non-test region 100 other than the at least one test region 100 in the display substrate.

Each thin film layer of the at least one conductive thin film layer is severed around the test region 100, which may make the test region 100 be electrically separated from the other regions. In this way, during the electrical characteristics test on the target thin film transistor Tg in the test region 100, it is possible to avoid that the voltages output by the test device is not fully applied to the source region 61a, the drain region 61b or the gate 71 of the target thin film transistor Tg due to couplings between the test region 100 and other regions through the at least one conductive thin film layer, which affects the effect of test.

In some examples, in a case where two test regions 100 are adjacent, for example, in a case where the thin film transistor T3 and the thin film transistor T4 are both target thin film transistors Tg, test regions 100 corresponding to the two target thin film transistors Tg are adjacent. The method for manufacturing the test substrate 02 further includes severing conductive thin film layers in the two adjacent test regions 100. In this way, it is possible to avoid that a test result is affected due to a coupling between the conductive thin film layers of the two adjacent test regions 100 during the electrical test.

For example, as shown in FIG. 14, a plurality of thin film layers stacked in sequence are severed at an interface between the two adjacent test regions 100.

For example, in a direction perpendicular to a film-forming surface of the base substrate 1, thin film layers such as the data lead layer 2, an interlayer insulating layer 5, a second electrode layer 8, a second insulating layer 4, a first metal layer 7 and a first insulating layer 3 shown in FIG. 13 are severed from top to bottom by using a focused ion beam (FIB) sputtering process.

In some embodiments, an orthographic projection of the test pin 9 on the base substrate 1 of the test substrate 02 is within an orthographic projection of the source region 61a, the drain region 61b or the gate 71 of the target thin film transistor Tg corresponding to the test pin 9 on the base substrate 1. That is to say, as shown in FIG. 7B, the test hole b corresponding to the test pin 9 only exposes the source region, the drain region or the gate 71 of the target thin film transistor Tg, and does not expose other thin film layers around the source region 61a, the drain region 61b or the gate 71.

In this way, there are no other thin film layers that are located in different layers from the source region 61a, the dram region 61b or the gate 71 at the bottom of the test hole b, thereby preventing a step between film layers at the bottom of the test hole b from affecting the flatness of the bottom of the test hole b. In a case where the bottom of the test hole b has a good flatness, the test pin 9 located in the test hole b may be in good contact with the source region 61a, the drain region 61b or the gate 71 that is exposed at the bottom of the test hole b, which is advantageous for improving the effect of the test on the target thin film transistor Tg.

Figure 15:
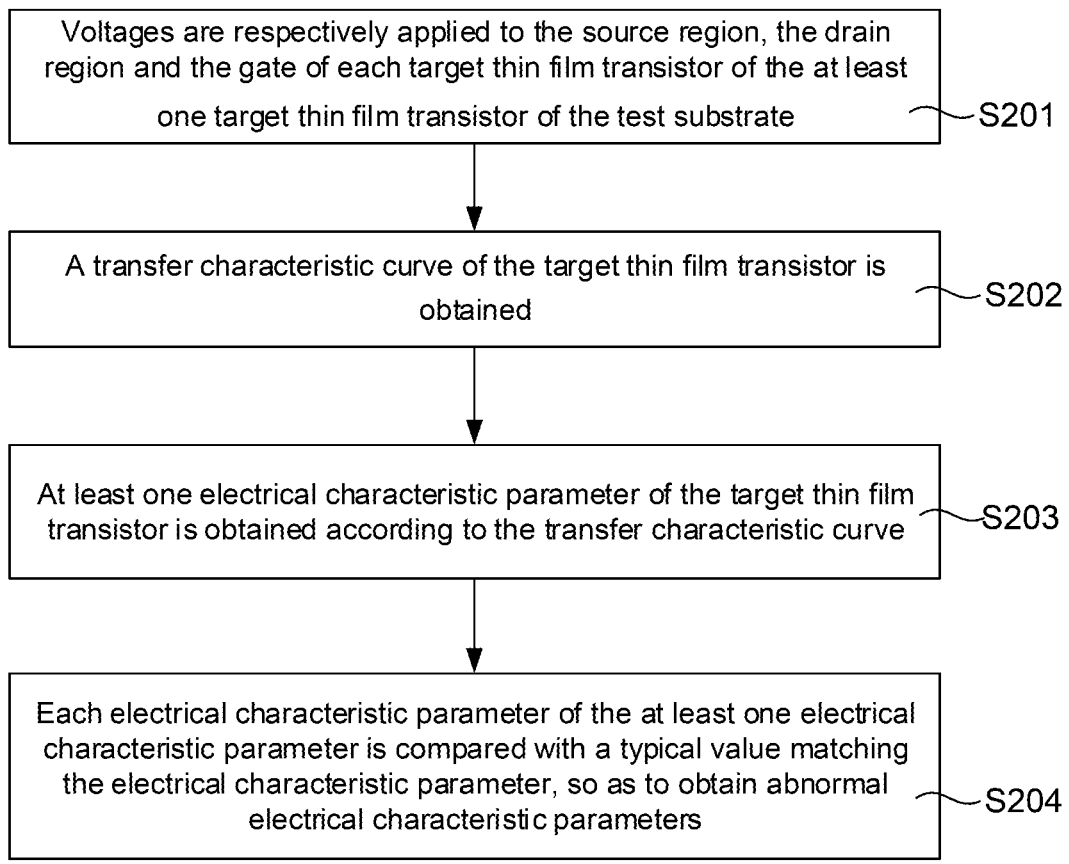
FIG. 15 is a flow diagram of a method for testing a test substrate, in accordance with some embodiments.

Some embodiments of the present disclosure further provide a method for testing the test substrate 02. As shown in FIG. 15, the method includes S201 to S204.

In S201, voltages are respectively applied to the source region 61a, the drain region 61b and the gate 71 of each target thin film transistor Tg of the at least one target thin film transistor Tg of the test substrate 02.

A voltage is applied to at least one of the source region 61a, the drain region b and the gate 71 in a way that the voltage is applied to the at least one of the source region 61a, the drain region 61b and the gate 71 through a test pin 9 coupled thereto.

In some examples, as will be seen from the above, as shown in FIG. 5A, in the case where one of the source region 61a, the drain region 61b and the gate 71 of the target thin film transistor Tg, for example, the gate 71, is coupled to the data lead DL through the via hole a, the probe of the test device is put onto the data lead DL and is in contact with it in S201, which may enable the test voltage to be provided to the gate 71 of the target thin film transistor Tg to which the data lead DL is coupled through the data lead DL. As for two of the source region 61a, the drain region 61b and the gate 71 of the target thin film transistor Tg that are not coupled to the data leads DL through the via holes a, for example, the source region 61a and the drain region 61b, the probes of the test device are put onto the test pins 9 to which the source region 61a and the drain region 61b are respectively coupled to be in contact with them in S201, which may enable the test voltages to be provided to the source region 61a and the drain region 61b of the target thin film transistor Tg to which the test pins 9 are coupled through the test pins 9.

In some examples, as will be seen from the above, as shown in FIG. 5B, in the case where two of the source region 61a, the drain region 61b and the gate 71 of the target thin film transistor Tg, for example, the gate 71 and the source region 61a, are coupled to two data leads DL through the via holes a, the probes of the test device are put onto the two data leads DL to be in contact with them in S201, which may enable the test voltages to be provided to the gate 71 and the source region 61a of the target thin film transistor Tg to which the two data leads DL are coupled through the two data leads DL. As for one of the source region 61a, the drain region 61b and the gate 71 of the target thin film transistor Tg that is not coupled to the data leads DL through the via holes a, for example, the drain region 61b, the probes of the test device are put onto the test pin 9 to which the drain region 61b is coupled to be in contact with them in S201, which may enable the test voltage to be provided to the drain region 61b of the target thin film transistor Tg to which the test pin 9 is coupled through the test pin 9.

In some other examples, as will be seen from the above, as shown in FIG. 5C, in the case where none of the source region 61a, the drain region 61b and the gate 71 of the target thin film transistor Tg are coupled to the data leads DL through the via holes a, the probes of the test device are put onto the three test pins 9 to which the source region 61a, the drain region 61b and the gate 71 are coupled and are in contact with them in S201, which may enable the test voltages to be provided to the source region 61a, the drain region 61b and the gate 71 of the target thin film transistor Tg to which the three test pins 9 are coupled through the three test pins 9.

In S202, a transfer characteristic curve of the target thin film transistor Tg is obtained.

In some embodiments, S202, in which the transfer characteristic curve of the target thin film transistor Tg is obtained, includes:

recording values of currents output by the drain of the target thin film transistor Tg when different values of voltages are applied to the source region 61a, the drain region 61b and the gate 71 of the target thin film transistor Tg; and obtaining the transfer characteristic curve of the target thin film transistor Tg according to different values of the voltages applied to the source region 61a and the gate 71 of the target thin film transistor and the value of the current output by the drain of the target thin film transistor.

Figure 16:
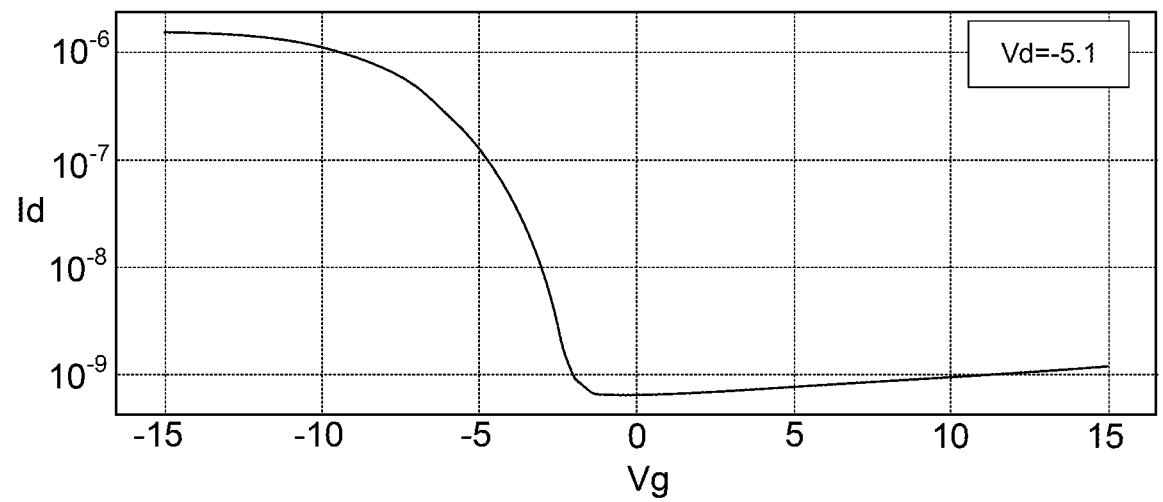
FIG. 16 is a diagram showing a transfer characteristic curve of a target thin film transistor, in accordance with some embodiments.

For example, in a case where the thin film transistor T3 in FIG. 3 is the target thin film transistor Tg, a transfer characteristic curve of the thin film transistor T3 is shown in FIG. 16. The abscissa Vg is shown in FIG. 16.

In S203, at least one electrical characteristic parameter of the target thin film transistor Tg is obtained according to the transfer characteristic curve.

Various electrical characteristic parameters of the target thin film transistor Tg that are obtained according to the transfer characteristic curve in S203 and typical values of the characteristic parameters are shown in Table 1.

TABLE 1

| Vth | IDVG0 | SS | SR_Range | MOB | $I_{on}$ | $I_{off}$ |
|-----|-------|-----|----------|-----|------|-------|

In Table 1, Vth is a threshold voltage of Tg; IDVG0 is a drain current Id of the TFT when a gate voltage Vg of the TFT is 0V; SS is sub-threshold voltage swing; DR-range is a voltage variation range of the TFT from an off state to an on state; MOB is an electron mobility; $I_{on}$ is an on-state current of Tg, and $I_{off}$ is an off-state current of Tg.

In S204, each electrical characteristic parameter of the at least one electrical characteristic parameter is compared with a typical value matching the electrical characteristic parameter, so as to obtain abnormal electrical characteristic parameters.

Setting of the typical value of the electrical characteristic parameter is not limited. For example, taking an example in which a typical value of Vth is −3.5V, according to the transfer characteristic curve shown in FIG. 16, Vth of the target thin film transistor Tg is −1.251V, which indicates that Vth of the target thin film transistor Tg is slightly forward biased.

Or, an order of magnitude of a typical value of $I_{off}$ is generally less than or equal to −11. In a case where $I_{off}$ of the target thin film transistor Tg is 3.21E-8 (ampere), $I_{off}$ of the target thin film transistor Tg is large.

In this way, according to the abnormal electrical characteristic parameters, it may be determined that an abnormal display is caused by the abnormal electrical characteristic parameters of the TFT. Therefore, according to the test result, in subsequent processes of manufacturing display substrates, a manufacturing process of the thin film transistors in the display substrate may be guided and improved, so that differences between the electrical characteristic parameters and the typical values of the manufactured thin film transistors are reduced. For example, the purpose of improving the product yield is achieved.

Some embodiments of the present disclosure further provide a display substrate including a plurality of thin film transistors. Electrical characteristic parameters of at least one of the plurality of thin film transistors are electrical characteristic parameters obtained after abnormal electrical characteristic parameters are corrected.

The abnormal electrical characteristic parameters are electrical characteristic parameters obtained after the test substrate 02 is tested through the method for testing the test substrate 02.

The electrical characteristic parameters of the target thin film transistor Tg are obtained by testing the test substrate 02 through the method for testing the test substrate 02, and the electrical characteristic parameters are the abnormal electrical characteristic parameters. There is at least one thin film transistor in the display substrate corresponding to the target thin film transistors Tg in the test substrate 02, for example, a correspondence between their positions. In the process of manufacturing the display substrates, the electrical characteristic parameters of the thin film transistors may be corrected by improving the manufacturing process or changing micro-structures of the thin film transistors, thereby improving display effect of the display substrate.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A test substrate, having at least one test region, the test substrate comprising:
   a base substrate;
   a plurality of thin film transistors disposed on a first side of the base substrate; each of the thin film transistors including a silicon island and a gate, and the silicon island including a source region, a drain region, and an active region between the source region and the drain region; and at least one of the thin film transistors being a target thin film transistor that is to be tested,
   each target thin film transistor being located in one of the at least one test region;
   at least one test hole located in the test region; each of the at least one test hole exposing a source region, a drain region or a gate of a con responding target thin film transistor at a bottom of the test hole; and
   at least one test pin, each of the at least one test pin located in one of the at least one test hole, one end of the test pin passing through the test hole to be coupled to the source region, the drain region or the gate of the corresponding target thin film transistor, and another end of the test pin being exposed at a surface of the test substrate.

2. The test substrate according to claim 1, further comprising a data lead layer disposed on a side of the plurality of thin film transistors away from the base substrate, the data lead layer including a plurality of data leads exposed at the surface of the test substrate, wherein
   the test pin is coupled to one of the data leads; and
   at least one the source region, the drain region and the gate of the target thin film transistor is coupled to a data lead, and each of the at least one of the source region, the drain region and the gate is coupled to a respective one of the data leads.

3. The test substrate according to claim 1, further comprising:
   an interlayer insulating layer disposed on a side of the plurality of thin film transistors away from the base substrate;
   a data lead layer disposed on a side of the interlayer insulating layer away from the base substrate, the data lead layer including a plurality of data leads exposed at the surface of the test substrate; and
   a plurality of via holes penetrating at least the interlayer insulating layer, wherein
   in a case where one of the source region, the drain region and the gate of the target thin film transistor is directly coupled to a data lead through one of the via holes,
   there are two test holes and two test pins located in the two test holes in the test region; and the two test pins are coupled to two of the source region, the drain region and the gate of the target thin film transistor that are not directly coupled to the data leads through the via hole, respectively; or
   in a case where two of the source region, the drain region and the gate of the target thin film transistor are directly coupled to the data leads through two of the via holes,
   there is a test hole and a test pin located in the test hole in the test region; and the test hole is coupled to one of the source region, the drain region and the gate of the target thin film transistor that is not directly coupled to the data leads through the two via holes.

4. The test substrate according to claim 1, further comprising:
   an interlayer insulating layer disposed on a side of the plurality of thin film transistors away from the base substrate;
   a data lead layer disposed on a side of the interlayer insulating layer away from the base substrate, the data lead layer including a plurality of data leads exposed at the surface of the test substrate; and
   a plurality of via holes penetrating at least the interlayer insulating layer, wherein
   in a case where none of the source region, the drain region and the gate of the target thin film transistor are directly coupled to the data leads through the via holes,
   there are three test holes and three test pins located in the three test holes in the test region; and the three test pins are coupled to the source region, the drain region and the gate of the target thin film transistor, respectively.

5. The test substrate according to claim 1, further comprising: a plurality of thin film layers disposed on the first side of the base substrate; the plurality of thin film layers forming the plurality of thin film transistors, and the plurality of thin film layers including at least one conductive thin film layer, wherein
   each thin film layer of the at least one conductive thin film layer is severed around the test region, and the test region is electrically separated from other regions; and
   the other regions include other test regions in the at least one test region other than the test region, and a non-test region in the display substrate other than the at least one test region.

6. The test substrate according to claim 1, wherein an orthographic projection of the test pin on the base substrate of the test substrate is within an orthographic projection of the source region, the drain region or the gate to which the test pin is coupled on the base substrate.

7. A method for manufacturing the test substrate according to claim 1, the manufacturing method comprising:
providing a first display substrate, the first display substrate including a base substrate and a plurality of thin film transistors disposed on a first side of the base substrate;
determining at least one target thin film transistor that is to be tested from the plurality of thin film transistors of the first display substrate, each of the at least one target thin film transistor including a silicon island and a gate, and the silicon island including a source region, a drain region and an active region between the source region and the drain region; and
defining at least one test region on the first display substrate, and the target thin film transistor being located in one of the at least one test region;
forming at least one test hole in the test region, each of the at least one test hole exposing a source region, a drain region or a gate of a target thin film transistor at a bottom of the test hole; and
forming a test pin in the test hole, the test pin being coupled to the source region, the drain region or the gate that is exposed by the test hole in which the test pin is located.

8. The manufacturing method according to claim 7, wherein in a case where the first display substrate further includes a data lead layer disposed on a side of the plurality of thin film transistors away from the base substrate, and the data lead layer includes a plurality of data leads exposed at a surface of the first display substrate,
the manufacturing method further comprises: coupling the test pin to one of the plurality of data leads after the test pin is formed in the test hole, wherein
the one data lead is adjacent to the test pin, and is not directly coupled to any one of a source region, a drain region and a gate of a target thin film transistor corresponding to the test pin.

9. The manufacturing method according to claim 7, wherein in a case where the first display substrate further includes a data lead layer disposed on a side of the plurality of thin film transistors away from the base substrate, the data lead layer includes a plurality of data leads exposed at a surface of the first display substrate, and one of the source region, the drain region and the gate of the target thin film transistor is directly coupled to a data lead,
forming the at least one test hole in the test region includes:
forming two test holes in the test region; the two test holes exposing two of the source region, the drain region and the gate of the target thin film transistor that are not directly coupled to data lead; or
in a case where the first display substrate further includes the data lead layer disposed on the side of the plurality of thin film transistors away from the base substrate, the data lead layer includes the plurality of data leads exposed at the surface of the first display substrate, and two of the source region, the drain region and the gate of the target thin film transistor are directly coupled to the data leads,
forming the at least one test hole in the test region includes:
forming a test hole in the test region, wherein the test hole exposes one of the source region, the drain region and the gate of the target thin film transistor that is not directly coupled to the data leads.

10. The manufacturing method according to claim 7, wherein in a case where the first display substrate further includes a data lead layer disposed on a side of the plurality of thin film transistors away from the base substrate, the data lead layer includes a plurality of data leads exposed at a surface of the first display substrate, and none of the source region, the drain region and the gate of the target thin film transistor are directly coupled to data leads,
forming the at least one test hole in the test region includes:
forming three test holes in the test region; the three test holes exposing the source region, the drain region and the gate of the target thin film transistor.

11. The manufacturing method according to claim 7, wherein in a case where the first display substrate further includes a plurality of thin film layers disposed on the first side of the base substrate, the plurality of thin film layers form the plurality of thin film transistors, and the plurality of thin film layers include at least one conductive thin film layer, the manufacturing method further comprises:
severing each thin film layer of the at least one conductive thin film layer around the test region, so that the test region is electrically separated from other regions, wherein
the other regions include other test regions in the at least one test region other than the test region, and a non-test region in the display substrate other than the at least one test region.

12. The manufacturing method according to claim 7, wherein forming the at least one test hole in the test region includes:
forming the at least one test hole by performing a sputtering process at a position corresponding to at least one of the source region, the drain region and the gate of the target thin film transistor by using a focused ion beam sputtering process according to at least one sputtering calculation model, so as to form the at least one test hole, wherein
parameters of each of the at least one sputtering calculation model include a size of an opening of a test hole to be formed, a depth of the test hole to be formed, and a voltage and/or a current applied to an ion beam.

13. The manufacturing method according to claim 12, wherein forming the at least one test hole in the test region further includes:
detecting an actual sputtering depth of the test hole to be formed by using an end-point detection method when the sputtering is performed at the position corresponding to the at least, one of the source region, the drain region and the gate of the target thin film transistor;
obtaining an image of the test hole to be formed in a case where a depth difference between a target sputtering depth and the actual sputtering depth is within a depth threshold range, and the image of the test hole being an electron beam image and/or an ion beam image; and
continuing performing the sputtering process in the test hole to be formed according to the image of the test hole until the actual sputtering depth of the test hole to be formed is the same as the target sputtering depth.

14. The manufacturing method according to claim 7, wherein forming the test pin in the test hole, the test pin being coupled to the source region, the drain region or the gate that is exposed by the test hole in which the test pin is located includes:
depositing a metal in the test hole by using a focused ion beam deposition process, so as to form the test pin.

15. The manufacturing method according to claim 14, the method further comprising: removing residual metal deposited around the test hole after the test pin is formed in the test hole.

16. The manufacturing method according to claim 15, wherein removing the residual metal around the test hole includes:
- removing the residual metal deposited around the test hole by using a focused ion beam sputtering process;
- obtaining an image of the target thin film transistor;
- determining whether the residual metal is completely removed, the image of the target thin film transistor being an electron beam image and/or an ion beam image;
- continuing removing the residual metal by using the focused ion beam sputtering process if the residual metal is not completely removed; and
- stopping removing the residual metal by using the focused ion beam sputtering process if the residual metal is completely removed.

17. The manufacturing method according to claim 7, wherein an orthographic projection of the test pin on the base substrate of the display substrate is within an orthographic projection of a source region, a drain region or a gate of a target thin film transistor to which the test pin is coupled on the base substrate.

18. The manufacturing method according to claim 7, wherein determining the at least one target thin film transistor that is to be tested from the plurality of thin film transistors of the first display substrate includes:
- performing a lighting test on a second display substrate to obtain a position of a defect, the second display substrate including a plurality of thin film transistors whose number, structures and positions are correspondingly the same as a number, structures and positions of the plurality of thin film transistors on the first display substrate; a thin film transistor at the position of the defect is token as a defective thin film transistor; and
- according to the position of the defective thin film transistor in the second display substrate, determining a thin film transistor at a same position in the first display substrate to be the at least one target thin film transistor.

19. A method for testing the test substrate according to claim 1,
the testing method comprising:
- applying voltages to the source region, the drain region and the gate of each of the at least one target thin film transistor of the test substrate, wherein a voltage is applied to at least one of the source region, the drain region and the gate in a way that the voltage is applied to the at least one of the source region, the drain region and the gate through a test pin coupled thereto;
- obtaining a transfer characteristic curve of the target thin film transistor;
- obtaining at least one electrical characteristic parameter of the target thin film transistor according to the transfer characteristic curve; and
- comparing each of the at least one electrical characteristic parameter with a typical value matching the electrical characteristic parameter, so as to obtain abnormal electrical characteristic parameters.

20. A display substrate, comprising a plurality of thin film transistors, wherein
- electrical characteristic parameters of at least one of the plurality of thin film transistors are electrical characteristic parameters obtained after abnormal electrical characteristic parameters are corrected; and
- the abnormal electrical characteristic parameters are electrical characteristic parameters obtained after the test substrate is tested through the testing method according to claim 19.

* * * * *